(12) United States Patent
Shibazaki

(10) Patent No.: US 7,589,823 B2
(45) Date of Patent: Sep. 15, 2009

(54) STAGE DEVICE, EXPOSURE APPARATUS, AND METHOD OF MANUFACTURING DEVICE

(75) Inventor: Yuichi Shibazaki, Kumagaya (JP)

(73) Assignee: Nikon Corporation, Tokyo (JP)

(*) Notice: Subject to any disclaimer, the term of this patent is extended or adjusted under 35 U.S.C. 154(b) by 251 days.

(21) Appl. No.: 11/133,372

(22) Filed: May 20, 2005

(65) Prior Publication Data

US 2005/0237510 A1 Oct. 27, 2005

Related U.S. Application Data

(63) Continuation-in-part of application No. PCT/JP2004/004718, filed on Mar. 31, 2004.

(30) Foreign Application Priority Data

Apr. 1, 2003 (JP) ............................. 2003-098464

(51) Int. Cl.
G03B 27/58 (2006.01)
G03B 27/62 (2006.01)
(52) U.S. Cl. .......................................... 355/72; 355/75
(58) Field of Classification Search .................. 355/53, 355/72–76; 310/10, 12; 318/649
See application file for complete search history.

(56) References Cited

U.S. PATENT DOCUMENTS

| | | | |
|---|---|---|---|
| 4,952,858 A | 8/1990 | Galburt | |
| 5,699,621 A | 12/1997 | Trumper et al. | |
| 6,226,075 B1 | 5/2001 | Loopstra et al. | |
| 6,337,484 B1 | 1/2002 | Loopstra et al. | |
| 6,724,000 B2 * | 4/2004 | Hazelton | 250/442.11 |
| 6,741,332 B2 * | 5/2004 | Nishi | 355/72 |
| 6,777,833 B1 | 8/2004 | Williams | |
| 6,788,385 B2 * | 9/2004 | Tanaka et al. | 355/53 |
| 6,819,433 B2 | 11/2004 | Takai et al. | |
| 2002/0063856 A1 * | 5/2002 | Inoue | 355/53 |
| 2005/0003918 A1 | 1/2005 | Hayashi | |

FOREIGN PATENT DOCUMENTS

| | | |
|---|---|---|
| EP | 1 111 469 A2 | 6/2001 |
| JP | A-02-139146 | 5/1990 |
| JP | A 02-139146 | 5/1993 |
| JP | A-09-293773 | 11/1997 |
| JP | A-11-142556 | 5/1999 |
| JP | A 2001-037201 | 2/2001 |
| JP | A 2002-093686 | 3/2002 |
| JP | A-2002-093686 | 3/2002 |
| JP | A1-WO02/080185 | 10/2002 |
| JP | A 2002-319541 | 10/2002 |
| JP | A 2002-343706 | 11/2002 |
| WO | WO 97/30819 | 8/1997 |
| WO | WO 00/36734 | 6/2000 |

* cited by examiner

*Primary Examiner*—Hung Henry Nguyen
(74) *Attorney, Agent, or Firm*—Oliff & Berridge, PLC

(57) ABSTRACT

A drive device has movable elements connected to a stage and stationary elements arranged in one predetermined axial direction. The drive device causes the stage to generate drive force parallel to a two-dimensional plane and drives the stage in a direction in the two-dimensional plane and in a direction inclined relative to the two-dimensional plane. The structure above makes it possible to move the stage in the directions in the two-dimensional plane and the inclined plane without employing, as conventionally used, a structure having a two-dimensionally moving stage and a table movable on the stage in the inclined direction, and thus the stage can be formed as a simple integrated body.

16 Claims, 10 Drawing Sheets

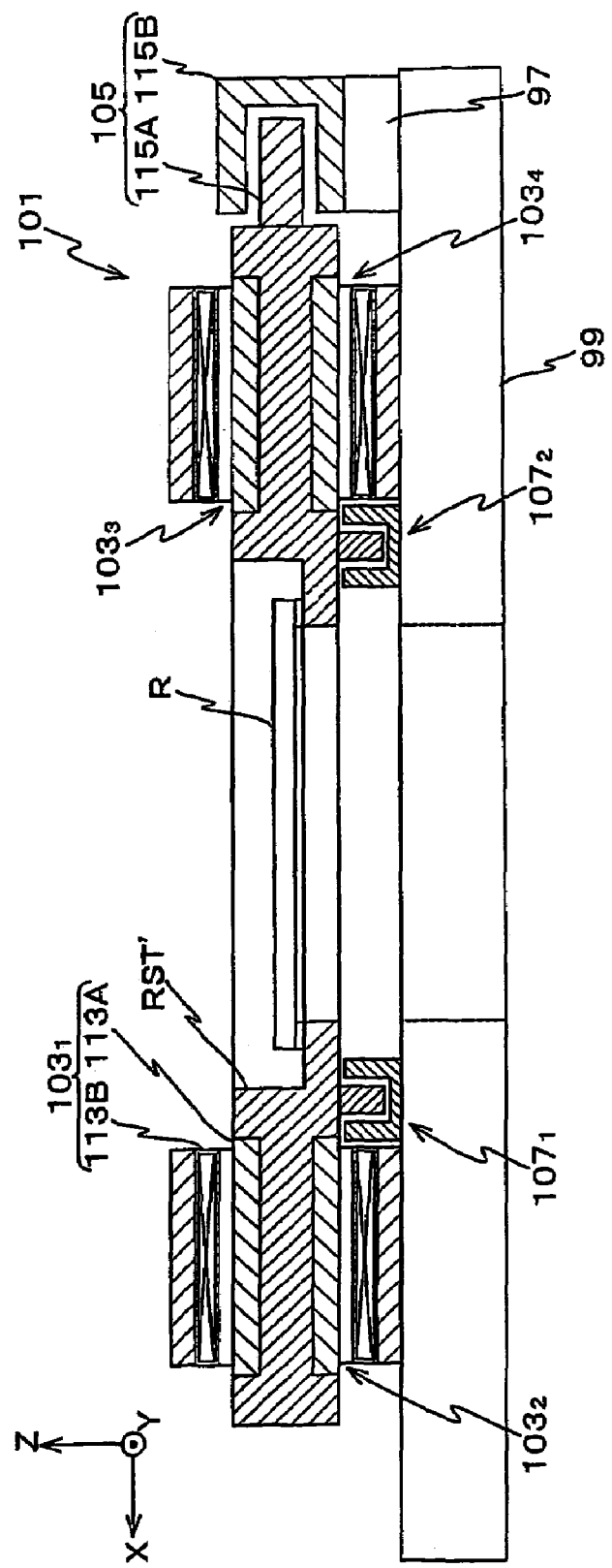

STAGE DEVICE, EXPOSURE APPARATUS, AND METHOD OF MANUFACTURING DEVICE

RELATED APPLICATIONS

This is a Continuation-In-Part of International Application No. PCT/JP04/004718 filed Mar. 31, 2004. The entire disclosure of said International Application No. PCT/JP04/004718 is incorporated by reference herein in its entirety. The disclosure of the following priority application is herein incorporated by reference in its entirety: Japanese Patent Application No. 2003-098464 filed Apr. 1, 2003.

BACKGROUND OF THE INVENTION

1. Field of the Invention

This invention relates to a stage device and an exposure apparatus, and more specifically to a stage device provided with a stage that holds and moves an object, an exposure apparatus provided with the stage, and methods of manufacturing a device using the exposure apparatus.

2. Description of Related Art

In a lithographic process that manufactures a semiconductor element, a liquid crystal display element, or the like, a step-and-repeat type reduction projection exposure apparatus (so-called stepper) and a step-and-scan type scanning projection exposure apparatus (so-called scanning stepper) that improves upon the stepper are mainly used. Each of these apparatus transfers a pattern formed on a mask or a reticle (hereafter referred to as "reticle") onto a photosensitive object such as a wafer, glass plate, or the like, coated by resist or the like through a projection optical system.

In a projection exposure apparatus such as a stepper, a stage device is used that includes a table that holds a wafer that is an object to be exposed, a stage that holds and two-dimensionally moves the table, and a drive mechanism that drives the stage. Recently, as a stage device, a linear motor type stage device that has a linear motor as a drive source has become the mainstream. As this linear motor type stage device, a two-axis drive linear motor type stage device is relatively frequently used and is provided with a first axis linear motor that drives a stage in a first axis direction, and a pair of second axis linear motors that integrally drive the first axis linear motor and the stage in a second axis direction perpendicular to the first axis.

In this type of stage device, as is disclosed in, for example, International Publication WO 02/080185, a table is connected to a stage via a micro-moving mechanism such as three voice coil motors and three EI cores. By the micro-moving mechanism, the table can be micro-moved in a rotation direction about a first axis, a rotation direction about a second axis, and a third axis direction perpendicular to the first and second axes, respectively. Driving is accomplished by the micro-moving mechanism and the linear motors in six degrees-of-freedom directions.

In the stage device described in the above-mentioned International Publication WO 02/080185, in order to support a stage in a non-contact manner with respect to a moving reference surface, an air pad is provided that forms a predetermined clearance between the stage and the moving reference surface. However, this air pad has high stiffness. Therefore, as shown in FIG. 11A, according to a convex/concave state of a moving reference surface BS, there is a case that a stage ST becomes inclined (pitching-vibrated). In such a case, according to stage inclination, there was a possibility that a table TB might be slid (shift-vibrated).

Furthermore, when the table TB and the stage ST are coupled by a plate spring, the portion coupled by the plate spring has high stiffness, so there was a possibility that shift vibration might be generated in the table as shown in FIG. 11B.

Additionally, as shown in FIG. 11C, with leveling control of a table using a voice coil motor, an EI core, or the like, there also is a possibility that shift external disturbance might be generated in the table.

The above-described shift vibration and shift external disturbance of the table can be considered to be results of effects such as characteristic frequency and stiffness expressed as negative influences on stage control because the table is plate-shaped.

SUMMARY OF THE INVENTION

According to a first aspect of the invention, a first stage device includes a stage that holds an object and that can be moved at least in a direction within a two-dimensional plane perpendicular to a direction of gravity and in a direction inclined with respect to the two-dimensional plane. The first stage device also includes a drive device that includes a plurality of movable elements connected to the stage and a plurality of stators arranged along a single predetermined axial direction within the two-dimensional plane, and that drives the stage by a drive force in a direction parallel to the two-dimensional plane.

According to this aspect of the invention, by using a drive device provided with a plurality of movable elements connected to the stage and a plurality of stators arranged along a single predetermined axial direction, the stage is driven in a direction within a two-dimensional plane and in a direction inclined with respect to the two-dimensional plane by applying a drive force to the stage that is parallel to the two-dimensional plane. By doing this, without using a conventional complex stage provided with a moving body that can be moved within a two-dimensional plane and a table that can be moved in the inclination direction on the moving body, a stage, and thus an object held by the stage, can be moved in at least one degree-of-freedom in a direction within the two-dimensional plane and in a direction inclined with respect to the two-dimensional plane (one degree-of-freedom direction or two degrees-of-freedom directions). In this case, the stage can be manufactured as an integrated object, so the stage structure can be simplified. At the same time, there is no possibility that position controllability of the table deteriorates due to the same cause of the deterioration of position controllability of the table due to the combination of a two-dimensional moving stage and table, which was a conventional problem. Therefore, position controllability of an object held by a stage can be accomplished in a simplified structure with high accuracy.

In a preferred embodiment, the drive device can drive the stage in a rotation direction within the two-dimensional plane. In such a case, the stage can be driven in five degrees-of-freedom directions.

In a preferred embodiment, the drive device also can drive the stage in the direction of gravity. In this case, a stator that drives the stage in the direction of gravity can be arranged among a plurality of stators that drive the stage in a direction within the two-dimensional plane.

In a preferred embodiment, the drive device can drive the stage with three degrees-of-freedom within the two-dimensional plane, two degrees-of-freedom in a direction inclined with respect to the two-dimensional plane, and one degree-of-freedom in the direction of gravity.

In a preferred embodiment, the stage can be box-shaped. In this case, stiffness can be obtained that is higher than that of a plate-shaped stage.

The stage device according to the first aspect of this invention also can include a self-weight support mechanism. The self-weight support mechanism is provided with a cylinder portion arranged on a bottom portion of the stage and a piston portion that is inserted into the cylinder portion and can be moved relative to the cylinder portion. The self-weight support mechanism supports the weight of the stage above a predetermined support surface by a positive pressure of a gas inside the cylinder portion that downwardly urges the piston portion in the direction of gravity.

According to this modification, it is preferable that a position detector be further provided that is arranged in the vicinity of the self-weight support mechanism and detects a position of the stage.

According to a second aspect of this invention, a second stage device includes a stage that holds an object and that can be moved within a plane perpendicular to a direction of gravity and a self-weight support mechanism. The self-weight support mechanism is provided with a cylinder portion arranged on the stage and a piston portion that is inserted into the cylinder portion and can be moved relative to the cylinder portion. The self-weight support mechanism supports the weight of the stage above a predetermined support surface by a positive pressure of a gas inside the cylinder portion that downwardly urges the piston portion in the direction of gravity.

According to this aspect of the invention, through the self-weight support mechanism, the weight of the stage is supported by a positive pressure of a gas. Thus, stiffness can be lower than that of a conventional air bearing. Therefore, transmission to the stage of vibration of a support member (stage base) where a support surface is formed can be suppressed to an extremely small amount. As a result, position control of a stage, and in turn, an object held by the stage, can be accomplished with high accuracy.

The self-weight support mechanism can be provided with a first bearing mechanism that forms a predetermined clearance with the support surface. The first bearing mechanism can include a gas exit port formed on a surface of a side opposite to the support surface of the piston portion and an air supply line that is formed in the piston portion and connects the gas exit port and a positive pressure space inside the cylinder.

In addition to the first bearing mechanism, a second bearing mechanism can be further provided that forms a predetermined clearance between an inner circumferential surface of the cylinder portion and an outer circumferential surface of the piston portion. The second bearing mechanism can include a gas exit port formed on the outer circumferential surface of the piston portion and an air supply line that is formed in the piston portion and connects the gas exit port and a positive pressure space inside the cylinder.

The self-weight support mechanism can be arranged at least at three locations that are not in a straight line.

The respective first and second stage devices also can include a stage base on which the support surface is formed. The stage base can be moved according to the law of conservation of momentum due to an operation of a reaction force generated when a drive force moves the stage in a direction within the two-dimensional plane. A drive mechanism that drives the stage base within the two-dimensional plane can be further provided.

In the respective first and second stage devices, a light beam interference type length measurement device can be further provided that irradiates a length measurement beam onto a reflective surface arranged on the stage, receives the light of the length measurement beam reflected at the reflective surface, and measures the position of the stage in the direction of gravity.

According to a third aspect of this invention, a third stage device includes a plurality of stages that each hold an object and a drive system that drives the respective stages at least in a direction within a two-dimensional plane perpendicular to a direction of gravity and in a direction inclined with respect to the two-dimensional plane by using a drive force in a direction parallel to the two-dimensional plane.

According to this aspect of the invention, the drive system individually drives a plurality of stages that hold an object, respectively, at least in a direction within a two-dimensional plane perpendicular to the direction of gravity and in a direction inclined with respect to the two-dimensional direction by using a drive force in a direction parallel to the two-dimensional plane. Thus, a stage that is an integrated object can be used for each stage. Therefore, in the same manner as previously described, position control of the object held by each stage can be accomplished with high accuracy. Additionally, a plurality of stages are provided, so it also is expected that throughput will be improved by parallel processing using a plurality of stages.

According to another aspect of this invention, an exposure apparatus that illuminates a mask by an energy beam and transfers a pattern formed on the mask onto a photosensitive object, is provided with any of the first-third stage devices summarized above as a drive system of at least one of the mask and the photosensitive object. According to this aspect, any of the first-third stage devices, which have good position controllability, is provided as the drive system for at least one of the mask and the photosensitive body. Thus, the pattern formed on the mask can be transferred to the photosensitive body with high accuracy.

Furthermore, in a lithographic process, as exposure is performed by using the exposure apparatus, a pattern can be accurately formed on the photosensitive object. Thus, a micro device having high integration can be manufactured With good yield. Thus, another aspect of this invention relates to a method of manufacturing a device using the exposure apparatus of aspects of the invention.

BRIEF DESCRIPTION OF THE DRAWINGS

The invention will be described in conjunction with the following drawings of exemplary embodiments in which like reference numerals designate like elements, and in which:

FIG. 10 is a diagram showing an example when the stage device of aspects of this invention is used as a drive system of a reticle.

DETAILED DESCRIPTION OF EXEMPLARY EMBODIMENTS

Figure 1:
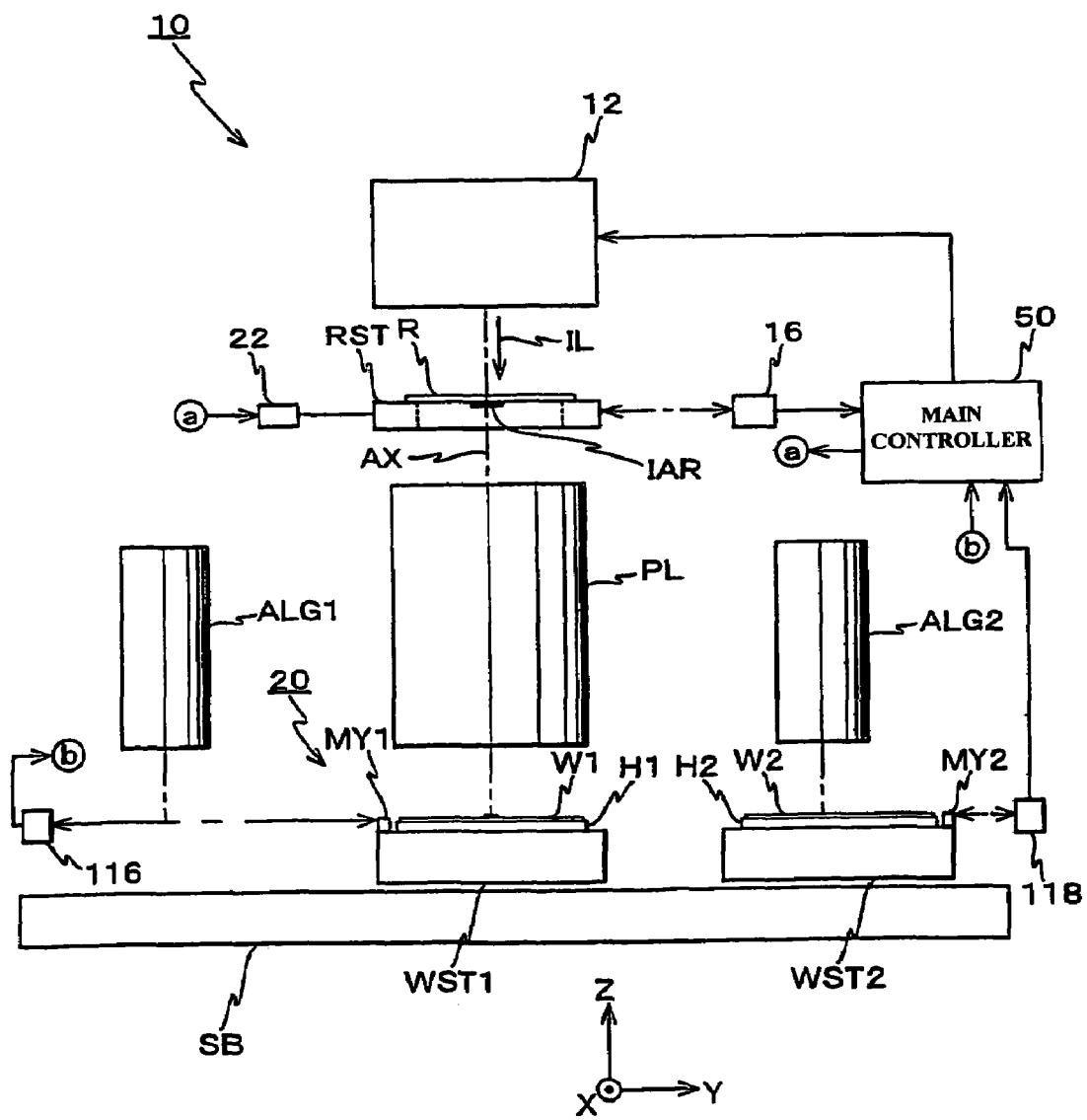
FIG. 1 is a diagram schematically showing a structure of an exposure apparatus according to an exemplary embodiment of this invention.

An exemplary embodiment of this invention is explained with reference to FIGS. 1-8. FIG. 1 schematically shows an exposure apparatus 10 of an exemplary embodiment.

The exposure apparatus 10 is an exposure apparatus, i.e., a so-called scanning stepper, that synchronously moves a reticle R as a mask and a wafer W1 (or W2) as an object (a photosensitive object) in a one-dimensional direction (here, a Y-axis direction that is the right/left direction within the paper plane of FIG. 1), to transfer a circuit pattern formed on the reticle R to a plurality of shot areas on the wafer W1 (or W2) via a projection optical system PL.

The exposure apparatus 10 is provided with an illumination system 12 that illuminates the reticle R by illumination light IL as an energy beam, a reticle stage RST as a mask stage on which the reticle R is mounted, a projection optical system PL that projects the illumination light IL emitted from the reticle R onto the wafer W1 (or W2), a stage device 20 on which the wafer W1 (or W2) is mounted, and control systems, etc. of these components.

The illumination system 12 includes a light source and an illumination optical system, irradiates the illumination light IL onto a rectangular or arc-shaped illumination region IAR that is regulated by a field stop (also called a "masking blade" or a "reticle line") arranged inside the illumination system, and illuminates the reticle R, in which a circuit pattern is formed, with uniform irradiation. An illumination system that can be used as the illumination system 12 is disclosed in, for example, Japanese Laid-Open Patent Application 6-349701 and U.S. Pat. No. 5,534,970 corresponding thereto. The disclosure of the above-mentioned U.S. patent is incorporated herein by reference in its entirety.

Here, far ultraviolet light, such as a KrF excimer laser (wavelength 248 nm) and an ArF excimer laser (wavelength 193 nm), and vacuum ultraviolet light such as an $F_2$ laser (wavelength 157 nm) are used as the illumination light IL. Bright lines (g line, i line, etc.) of the ultraviolet region from an ultra high-pressure mercury lamp also can be used as the illumination light IL.

On the reticle stage RST, the reticle R is fixed by, for example, vacuum adsorption. The reticle stage RST can be micro-driven in an X axis direction within an XY plane perpendicular to an optical axis (matching an optical axis AX of the projection optical system PL) of the illumination system 12, a Y axis direction, and a θz direction (rotation direction about the Z axis) and also can be driven at a scanning velocity designated for a predetermined scanning direction (Y axis direction) along the top surface of an undepicted reticle stage base. Furthermore, the reticle stage drive portion 22 is a mechanism that has a linear motor, a voice coil motor, etc., as a drive source. However, in FIG. 1, this is shown as a block for ease of illustration. Additionally, as the reticle stage RST, a stage having a coarse/micro-moving structure also can be used that is provided with a coarse stage that is one-dimensionally driven in the Y axis direction and a micro-moving stage that can micro-drive the reticle R in at least three degrees-of-freedom directions (X-axis direction, Y-axis direction, and θz direction) with respect to the coarse stage.

The position (including the θz rotation) within the XY plane of the reticle stage RST is constantly detected by a reticle laser interferometer (hereafter referred to as "reticle interferometer") 16 via a reflective surface formed (or arranged) on an end portion of the reticle stage RST at a resolution of, for example, approximately 0.5-1 nm. Positional information (including rotation information such as θz rotation amount (yawing amount) or the like) of the reticle stage RST from the reticle interferometer 16 is supplied to a main controller 50. In the main controller 50, based on the positional information of the reticle stage RST, drive control of the reticle stage RST via the reticle stage drive portion 22 is performed.

As the projection optical system PL, a reduction system is used in which both an object surface side (reticle side) and an image plane side (wafer side) are telecentric, and the projection magnification thereof is ¼ (or ⅕). Because of this, when illumination light (ultraviolet pulse light) IL is irradiated to the reticle R from the illumination system 12, an imaging light beam from the portion of the circuit pattern region formed on the reticle R illuminated by the ultraviolet pulse light enters the projection optical system PL, and an image (partial inverted image) of the circuit pattern of the irradiated region (the above-mentioned illumination region IAR) of the illumination light IL is limited and imaged in a slit shape (or rectangular shape (or polygon)) that is elongated in the X axis direction in the center of a field of view of the image plane side of the projection optical system PL, for each pulse irradiation of the ultraviolet pulse light. Because of this, the partial inverted image of the projected circuit pattern is reduced and transferred to a resist layer of one shot area surface among a plurality of shot areas on the wafer W1 or W2 arranged at the imaging plane of the projection optical system PL.

As the projection optical system PL, when a KrF excimer laser or an ArF excimer laser is used for the illumination light IL, a dioptric system constituted by only refractive optical elements (lens elements) is mainly used. However, if an $F_2$ laser is used for the illumination light IL, as disclosed in, for example, Japanese Laid-Open Patent Application 3-282527 and U.S. Pat. No. 5,220,454 corresponding to this publication, a so-called catadioptric system in which refractive optical elements and reflective optical elements (concave surface mirror, beam splitter, etc.) are combined, or a reflective system constituted by only reflective optical elements, is mainly used. The disclosure of the above-mentioned U.S. patent is incorporated herein by reference in its entirety. However, even when an $F_2$ laser is used, the dioptric system also can be used.

In FIG. 1, the stage device 20 is arranged under the projection optical system PL and is provided with wafer stages WST1 and WST2 that hold wafers W1 and W2, respectively, as stages, and a drive system that individually drives wafer stages WST1 and WST2 in an X axis (first axis) direction, a Y axis (second axis) direction, a Z axis (third axis) direction, and six degrees-of-freedom directions in the rotation directions about the X, Y, and Z axes (θx, θy, θz directions). The respective wafer stages WST1 and WST2 are driven by a drive system in the X axis direction and in the Y axis direction at a predetermined stroke and micro-driven in the other directions.

Figure 2:
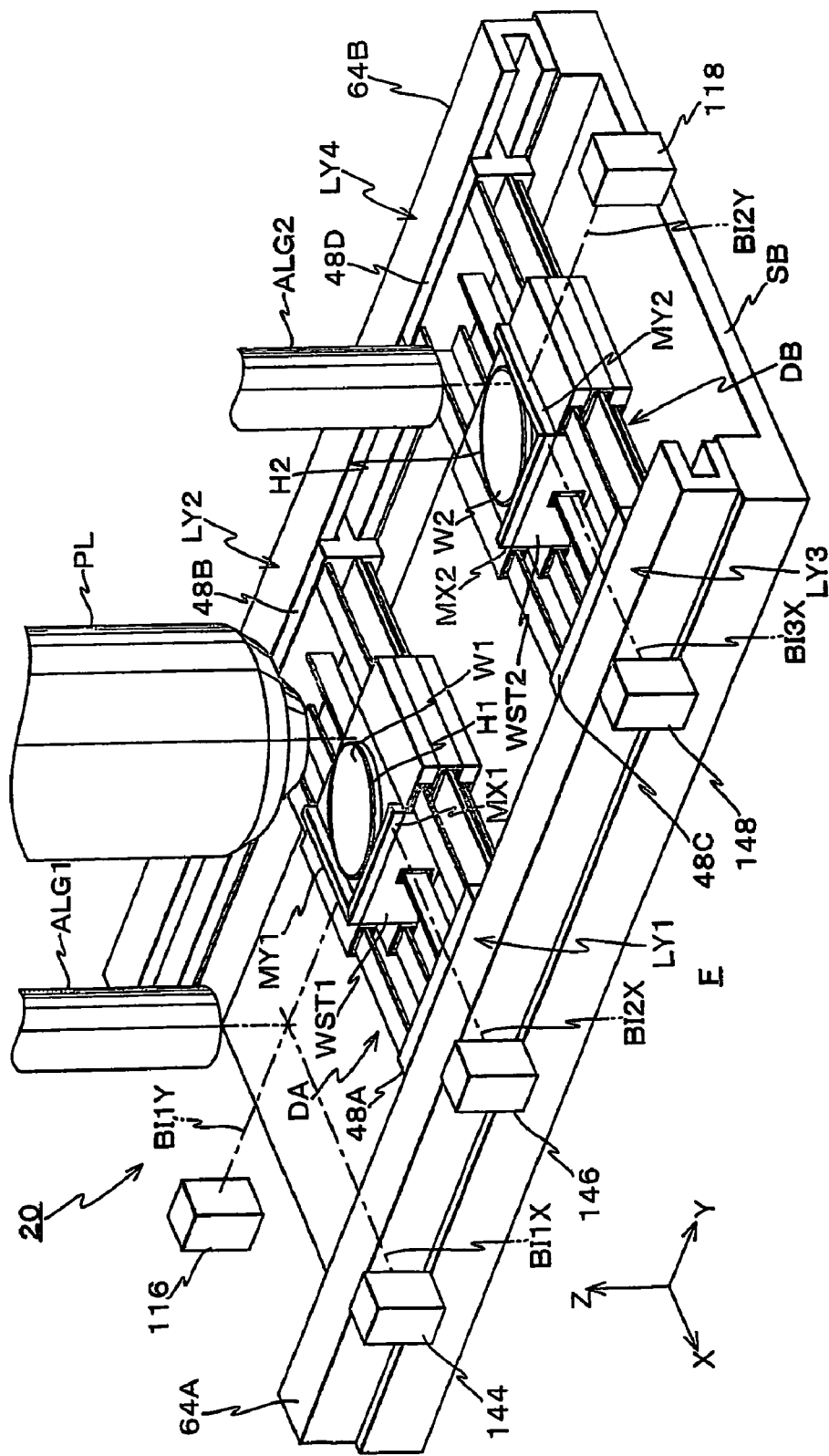
FIG. 2 is a perspective view showing a structure of a stage device of FIG. 1.

The following explains each structural part of the stage device 20 with reference to FIG. 2, which shows a perspective view of the stage device 20, and in other drawings as well.

As shown in FIG. 2, the wafer stages WST1 and WST2 are arranged above a stage base SB that is substantially horizontally supported via a plurality of (for example, three) vibration isolation units (undepicted) on a floor F of a clean room. The plurality of vibration isolation units insulate micro vibration (background vibration) that could be transmitted to the stage base SB from the floor F at a micro G level. Furthermore, as a plurality of vibration isolation units, so-called active vibration isolation devices can be used in which the stage base SB is positively damped based on the output of vibration sensors, such as semiconductor accelerometers, that are fixed respectively to predetermined locations of the stage base SB.

The wafer stage WST1 is formed of a light material with high stiffness, for example, MMC (a metal base composite material formed of a composition of metal and ceramics (aluminum alloy or metal silicon are used as a matrix material, and various ceramics reinforcement materials are combined therein)) and has a substantially box shape.

On the top surface (+Z side surface) of the wafer stage WST1, at one end portion (end portion of the +X side) in the X axis direction of FIG. 2, an X moving mirror MX1 is arranged that extends in the Y axis direction. At one end portion (end portion of the −Y side) in the Y axis direction, a Y moving mirror MY1 is arranged that extends in the X axis direction. As shown in FIG. 2, interferometer beams (length measurement beams) from interferometers of the respective length measurement axes constituting a later-mentioned interferometer system are projected to the respective reflective surfaces of the moving mirrors MX1, MY1. By receiving the reflected light by the respective interferometers, displacement from a reference position (in general, a fixed mirror is arranged on a projection optical system side surface or an alignment system side surface, and this is used as a reference surface) of the respective moving mirror reflective surfaces. Thus, the two-dimensional position of the wafer stage WST1 is measured. Furthermore, on the top surface of the wafer stage WST1, the wafer W1 is fixed by electrostatic or vacuum adsorption via a wafer holder H1. In addition, in FIG. 1, only the moving mirror MY1 is depicted as a moving mirror of the wafer stage WST1 side.

The wafer stage WST1 is driven by a drive device DA in the X axis direction at a predetermined stroke and is micro-driven in the remainder of the five degrees-of-freedom directions. That is, the wafer stage WST1 is driven by the drive device DA in six degrees-of-freedom directions. In addition, the drive device DA is driven by a pair of Y-axis linear motors LY1, LY2 integrally with the wafer stage WST1 in the Y axis direction at a long stroke.

Figure 3A:
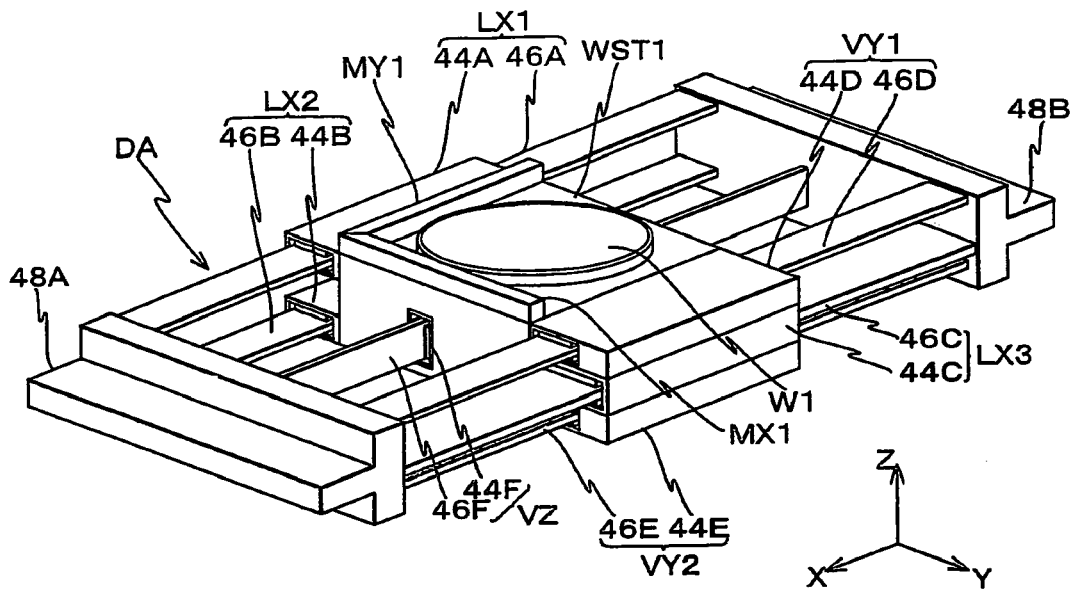
FIG. 3A is a perspective view showing a wafer stage WST1 and a drive device, taken out from the larger assembly.
Figure 3B:
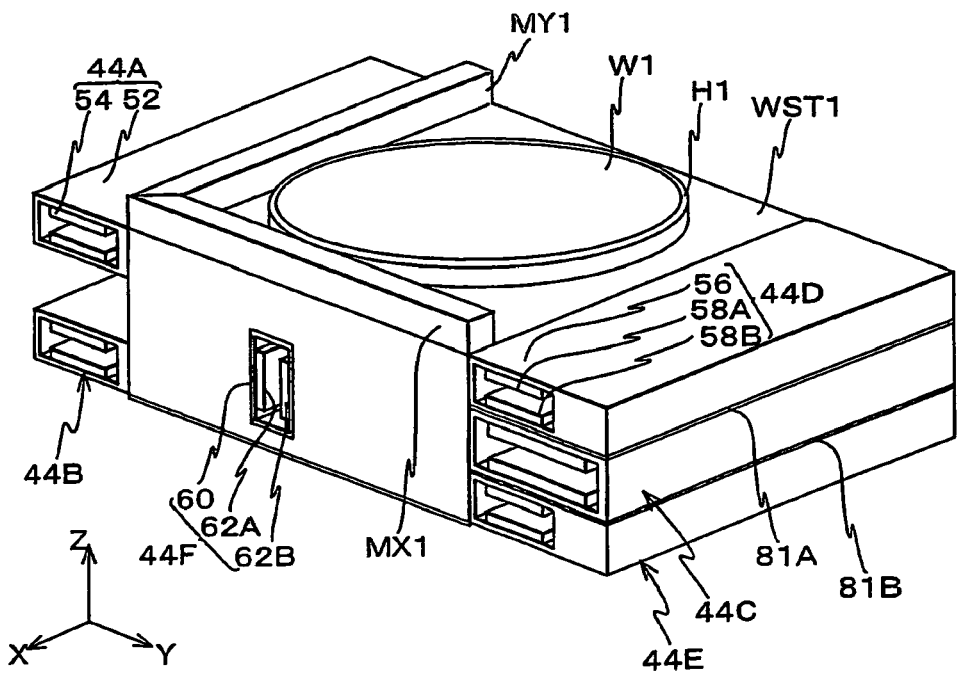
FIG. 3B is a perspective view showing the wafer stage WST1 taken out from the larger assembly.

Hereafter, the drive device DA is explained in detail. FIG. 3A is a perspective view showing the wafer stage WST1 and the drive device DA. FIG. 3B is a perspective view showing a movable portion including the wafer stage WST1.

As shown in FIG. 3A, the drive device DA is provided with six movable elements 44A-44F and six stators 46A-46F. Five of the movable elements (44A-44E) are fixed to the Y axis direction side surfaces of the wafer stage WST1, and one movable element (44F) is embedded in the wafer stage WST1. The six stators 46A-46F are inserted into the respective internal portions (hollow portions) of the movable elements 44A-44F as shown in FIG. 3A, and extend (are elongated) in the X axis direction. The end portions of the stators 46A-46F are fixed to Y axis movable elements 48A, 48B (which will be discussed later), which have a substantially T-shaped cross section. Thus, the positional relationship among the stators 46A-46F is maintained in a predetermined positional relationship.

As shown in FIG. 3B, the movable element 44A is provided with a yoke 52 that has a rectangular YZ cross section and that has an overall cylindrical shape. In addition, a plurality of field magnets 54 that face each other are respectively arranged at a predetermined interval along the X axis direction, on upper and lower surfaces inside of the yoke 52. In this case, the field magnets 54 adjacent to each other in the X axis direction and the field magnets 54 facing each other in the Z axis direction are mutually reverse-polarized. Because of this, in the interior space of the yoke 52, an alternating field is formed in the X axis direction.

Meanwhile, the stator 46A inserted into the movable element 44A is constituted by an armature unit including a hollow casing, where the X axis direction is a longitudinal direction, and a plurality of undepicted armature coils that are arranged at a predetermined interval along the X axis direction within the casing.

Due to Lorentz forces generated by an electromagnetic interaction between an electric current that flows through an armature coil forming the stator 46A and a magnetic field (alternating field) generated by field magnets forming the movable element 44A, a drive force in the X axis direction acts on the movable element 44A, and the movable element 44A is driven in the X axis direction along the stator 46A. That is, in this embodiment, a first X axis linear motor LX1 that is formed by a moving magnet type linear motor is constituted by the stator 46A and the movable element 44A (see FIG. 3A).

The movable element 44B is arranged on the lower side (−Z side) of the movable element 44A. The movable element 44B is constituted in the same manner as the movable element 44A. Furthermore, the stator 46B inserted into the movable element 44B (hollow portion) is constituted in the same manner as the stator 46A. Because of this, due to Lorentz forces generated by an electromagnetic interaction between an electric current that flows through an armature coil forming the stator 46B and a magnetic field (alternating field) generated by field magnets forming the movable element 44B, a drive force in the X axis direction acts on the movable element 44B, and the movable element 44B is driven in the X axis direction along the stator 46B. That is, in this embodiment, a second X axis linear motor LX2 that is formed by a moving magnet type linear motor is constituted by the stator 46B and the movable element 44B (see FIG. 3A).

The movable element 44C is fixed to the center portion, in the Z axis direction, of the +Y side surface of the wafer stage WST1 and is constituted in the same manner as the movable elements 44A, 44B, although its size is different. Furthermore, the stator 46C inserted into the movable element 44C (hollow portion) is constituted in the same manner as the stators 46A, 46B. Because of this, due to Lorentz forces generated by an electromagnetic interaction between an electric current that flows through an armature coil forming the stator 46C and a magnetic field (alternating field) generated by field magnets forming the movable element 44C, a drive force in the X axis direction acts on the moving element 44C and is driven in the X axis direction along the stator 46C. That is, in this embodiment, a third X axis linear motor LX3 formed by a moving magnet type linear motor is constituted by the stator 46C and the movable element 44C (see FIG. 3A). Furthermore, as is clear from FIGS. 3A and 3B, the third X axis linear motor LX3 is a linear motor larger than the first and second X axis linear motors LX1, LX2. Here, the third X axis linear motor LX3 can generate a thrust twice as large as that of the first and second X axis linear motors LX1, LX2. Furthermore, plate-shaped members 81A, 81B formed of non-magnetic bodies are attached respectively to the upper and lower surfaces of the movable element 44C (see FIG. 3B).

According to the first-third X axis linear motors LX1-LX3, the wafer stage WST1 can be driven in the X axis direction by controlling the size, direction, etc. of the electric current to be supplied to the armature coil within the stator (armature unit) forming the respective linear motors by the main controller 50 of FIG. 1 so that a thrust M is generated in the first and second X axis linear motors LX1, LX2, respectively, and a thrust (2×M) is generated in the third X axis linear motor LX3. Additionally, the wafer stage WST1 can be micro-driven in the rotation direction (θz direction) about the Z axis by controlling an electric current to be supplied to the armature coil within the armature unit that constitutes the respective linear motors by the main controller 50 so that a total thrust generated by the first and second X axis linear motors LX1, LX2 becomes slightly different from the thrust generated by the third X axis linear motor LX3. Furthermore, the wafer stage WST1 can be micro-driven in the rotation direction (θy direction) about the Y axis by controlling an electric current to be supplied to the armature coil within the armature unit that constitutes these linear motors by the main controller 50 so that the thrust generated by the first X axis linear motor LX1 becomes slightly different from the thrust generated by the second X axis linear motor LX2. That is, yawing control of the wafer stage WST1 can be performed by the first-third X axis linear motors LX1-LX3, and rolling control of the wafer stage WST1 can be performed by the first and second X axis linear motors LX1, LX2.

A movable element 44D is arranged via a plate-shaped member 81A on the upper side (+Z side) of the movable element 44C forming the third X axis linear motor LX3. This movable element 44D is provided with a frame-shaped member 56 formed of a magnetic body having an YZ cross section that is rectangular and permanent magnets 58A, 58B, that extend in the X axis direction and that are arranged on a pair of facing surfaces (upper and lower surfaces) inside of the frame-shaped member 56. The permanent magnets 58A and 58B are reverse-polarized to each other. Therefore, between the permanent magnets 58A and 58B, a magnetic field is generated where the magnetic flux direction is the +Z direction (or −Z direction). Furthermore, the stator 46D inserted into a space formed by the permanent magnets 58A, 58B and the frame-shaped member 56 is provided with a casing, and one or a plurality of armature coils that are arranged in the casing so that, for example, an electric current can be input only in the +X direction or only in the −X direction within the magnetic field of the Z axis direction formed within the movable element 44D. In this case, for an armature coil, for example, a pair of elongate coils can be used that extend in the X axis direction, and that are arranged at a predetermined interval in the Y axis direction.

In this embodiment, the size and the direction of the electric current to be supplied to the armature coil that constitutes the stator 46D is controlled by the main controller 50. Thus, the size and the direction of the drive force (Lorentz force) that drives the movable element 44D in the Y axis direction are arbitrarily controlled. That is, a first Y axis micro-moving motor VY1 that micro-drives the wafer stage WST1 in the Y axis direction is constituted by the movable element 44D and the stator 46D (see FIG. 3A).

The movable element 44E is arranged via the plate-shaped member 81B under the movable element 44C that constitutes the third X axis linear motor LX3. This movable element 44E is substantially symmetrical to the movable element 44D, with respect to the movable element 44C. The movable element 44E is constituted in the same manner as the movable element 44D, and a magnetic field of the +Z direction (or −Z direction) is generated inside the movable element 44E. Furthermore, as shown in FIG. 3A, a stator 46E is inserted into the hollow portion of the movable element 44E. This stator 46E is constituted in the same manner as the stator 46D.

In this embodiment, the size and the direction of the electric current to be supplied to the armature coil that constitutes the stator 46E are controlled by the main controller 50. Thus, the size and the direction of the drive force (Lorentz force) that drives the movable element 44E relative to the stator 46E in the Y axis direction are arbitrarily controlled. That is, a second Y axis micro-moving motor VY2 that micro-drives the wafer stage WST1 in the Y axis direction is constituted by the movable element 44E and the stator 46E (see FIG. 3A).

Therefore, according to the first and second Y axis micro-moving motors VY1, VY2, by generating the same thrust to the respective Y axis micro-moving motors VY1, VY2, the wafer stage WST1 can be micro-driven in the Y axis direction, and by making the thrust generated by the respective Y axis micro-moving motors VY1, VY2 different, the wafer stage WST1 can be micro-driven in the rotation direction (θx direction) about the X axis. That is, pitching control of the wafer stage WST1 can be performed by the first and second Y axis micro-moving motors VY1, VY2.

The movable element 44F is embedded in a state in which it passes through the wafer stage WST1 in the X axis direction in the substantially center portion of the wafer stage WST1. The movable element 44F is provided with a frame-shaped member 60 formed of a magnetic body having a YZ cross section that is rectangular and a pair of permanent magnets 62A, 62B that extend in the X axis direction and that are respectively arranged on a pair of facing surfaces (±Y side surfaces) inside of the frame-shaped member 60. The permanent magnets 62A and 62B are reverse-polarized to each other. Therefore, between the permanent magnets 62A and 62B, a magnetic field is generated where the magnetic flux direction is the +Y direction (or −Y direction). The stator 46F that is inserted into a space formed by the permanent magnets 62A, 62B and the frame-shaped member 60 is provided with a casing that has the X axis direction as a longitudinal direction, and one or a plurality of armature coils that are arranged in the casing so that, for example, an electric current can be input only in the +X direction or only in the −X direction within the magnetic field of the Y axis direction formed within the movable element 44F. In this case, for an armature coil, a pair of elongate coils can be used that extend in the X axis direction, and that are arranged at a predetermined interval in the Z axis direction.

In this embodiment, the size and the direction of an electric current to be supplied to the armature coil that constitutes the stator 46F is controlled by the main controller 50. Thus, the size and the direction of the drive force (Lorentz force) that drives the movable element 44F relative to the stator 46F in the Z axis direction are arbitrarily controlled. That is, a Z axis micro-moving motor VY2 that micro-drives the wafer stage WST1 in the Z axis direction is constituted by the movable element 44F and the stator 46F (see FIG. 3A).

Thus, according to the drive device DA, with respect to the wafer stage WST1, coarse movement in the X axis direction and micro-movement in the rotation direction (θz direction) about the Z axis and the rotation direction (θy direction) about the Y axis are performed by the first-third X axis linear motors LX1-LX3. Micro-movement in the Y axis direction and the rotation direction (θx direction) about the X axis is performed by the first and second Y axis micro-moving motors VY1, VY2. Micro-movement in the Z axis direction is performed by the Z axis micro-moving motor VZ.

The following explains a pair of Y axis linear motors LY1, LY2 that drives the wafer stage WST1 along with the drive device DA at a long stroke in the Y axis direction. The Y axis linear motor LY1 is provided with a stator 64A that is provided at the +X side end portion of the stage base SB and extends along the Y axis direction shown in FIG. 2, and a movable element 48A that is driven in the Y axis direction by an electromagnetic interaction with the stator 64A.

The stator 64A is provided with a cross-sectionally U-shaped yoke and a plurality of field magnets that are respectively arranged at predetermined intervals along the Y axis direction on a pair of facing surfaces (upper and lower surfaces facing each other) of the yoke. In this case, field magnets adjacent to each other in the Y axis direction and field magnets facing each other in the Z axis direction are reverse-polarized. Because of this, in the internal space of the yoke, an alternating field is formed in the Y axis direction. In this embodiment, in actuality, the stator 64A is substantially horizontally supported at a predetermined interval with respect to the top surface of the stage base SB by an undepicted support member arranged on the floor F.

The movable element 48A is arranged on one end portion of the stators 46A-46F that constitute the drive device DA (see FIG. 3A) and is constituted by a casing that is T-shaped in XZ cross-section and that has an inside portion that is hollow, and a plurality of undepicted armature coils arranged at a predetermined interval along the Y axis direction within the casing.

In this case, the movable element 48A is driven in the Y axis direction along the stator 64A by Lorentz forces generated by an electromagnetic interaction between an electric current that flows through an armature coil forming the movable element 48A and a magnetic field (alternating field) generated by field magnets forming the stator 64A. The size and the direction of the electric current that flows through the armature coil that constitutes the movable element 48A is controlled by the main controller 50.

The Y axis linear motor LY2 also is constituted in the same manner as the above-mentioned Y axis linear motor LY1, although, as shown, it is horizontally symmetrical in the Y axis direction. That is, the Y axis linear motor LY2 is provided with a stator 64B that is provided at the −Y side end portion of the stage base SB and extends in the Y axis direction, and a movable element 48B that is driven in the Y axis direction by an electromagnetic interaction with the stator 64B. In actuality, the stator 64B is substantially horizontally supported by an undepicted support member arranged on the floor F at a predetermined interval with respect to the upper surface of the stage base SB.

In this case as well, the size and the direction of the electric current that flows through the armature coil that constitutes the movable element 48B is controlled by the main controller 50, and the movable element 48B is driven in the Y axis direction along the stator 64B by Lorentz forces generated by an electromagnetic interaction between an electric current and a magnetic field (alternating field) generated by field magnets that constitute the stator 64B.

The wafer stage WST1, along with the drive device DA, is driven in the Y axis direction at a long stroke by the pair of Y axis linear motors LY1, LY2 constituted as described above. When the wafer stage WST1 is driven in the Y axis direction, the reaction force generated from the drive force acts on the stators 64A, 64B, but the reaction force is transmitted (released) to the floor F via the undepicted support members that support the stators 64A, 64B, respectively.

Furthermore, as is clear from the above-mentioned explanation, the wafer stage WST1 is micro-driven by the first and second Y axis micro-moving motors VY1, VY2 that constitute the drive device DA with respect to the Y axis direction, which is a scanning direction, and also is driven by a pair of Y axis linear motors LY1, LY2 within a predetermined stroke range.

The wafer stage WST2 is constituted in the same manner as the wafer stage WST1. That is, the wafer stage WST2 is constituted by a light member with high stiffness, of MMC or the like, and is approximately of a box shape. On the top surface (+Z side surface), an X moving mirror MX2 that extends in the Y axis direction is arranged on one end portion (end portion of the +X side) in the X axis direction of FIG. 2. On one end portion (end portion of the +Y side) in the Y axis direction, a Y moving mirror MY2 is arranged that extends in the X axis direction. Interferometer beams from interferometers of the respective measurement axes that constitute the later-mentioned interferometer system are projected to the respective reflective surfaces of the moving mirrors MX2, MY2, and the two-dimensional position of the wafer stage WST2 is measured in the same manner as the wafer stage WST1. Furthermore, in FIG. 1, only the moving mirror MY2 is depicted.

Furthermore, on the top surface of the wafer stage WST2, as shown in FIG. 2, the wafer W2 is fixed by electrostatic or vacuum adsorption via a wafer holder H2. By the drive device DB constituted in the same manner as the above-mentioned drive device. DA, the wafer stage WST2 is driven in the X axis direction at a predetermined stroke, and is micro-driven in the remainder of five degrees-of-freedom directions. Furthermore, a pair of movable elements 48C, 48D is respectively arranged on one end portion and another end portion, in the longitudinal direction, of the stators of the respective motors that constitute the drive device DB. A pair of Y axis linear motors LY3, LY4 is constituted by movable elements 48C, 48D and the pair of stators 64A, 64B. The drive device DB integrated with the wafer stage WST2 is driven by the Y axis linear motors LY3, LY4 in the Y axis direction at a long stroke. The size and the direction of the electric current to be supplied to the respective motors that constitute the drive device DB and the respective armature coils of the Y axis linear motors LY3, LY4 are controlled by the main controller 50.

As is clear from the above explanation, in this embodiment, the Y axis linear motors LY1, LY3 use the stator 64A in common, and the Y axis linear motors LY2, LY4 use the stator 64B in common. However, it is possible to arrange stators separately for each respective linear motor.

In this embodiment, as described above, a drive system is constituted in which the wafer stages WST1, WST2 are individually driven in six degrees-of-freedom directions, the drive system including the drive devices DA, DB, and the Y axis linear motors LY1-LY4.

Figure 4A:
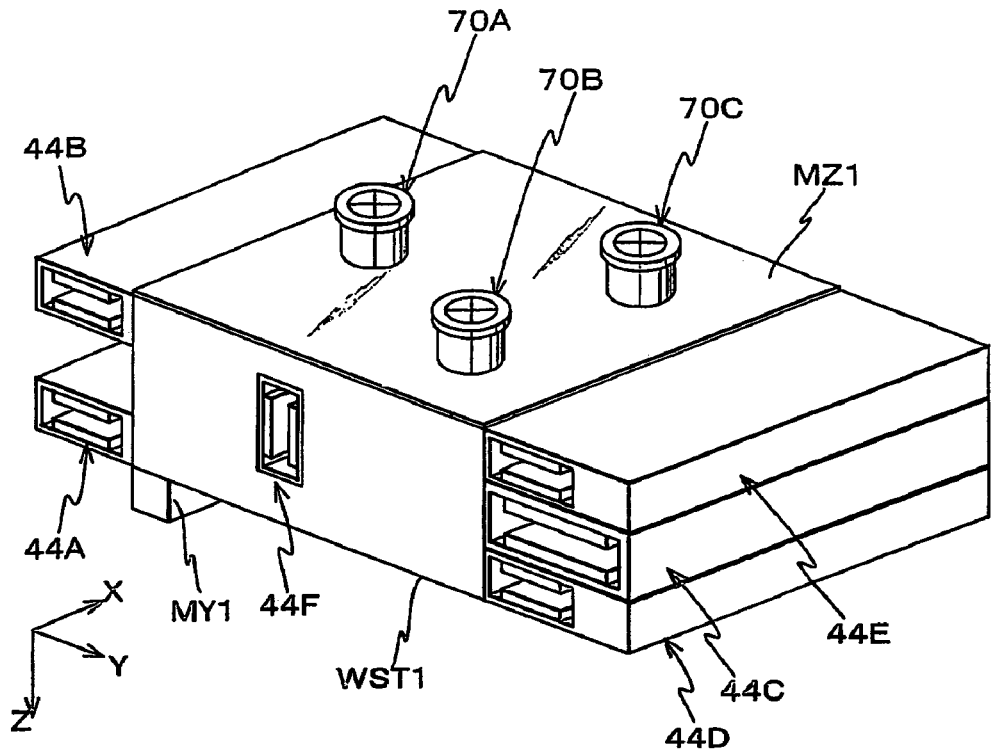
FIG. 4A is a perspective view showing a state in which a wafer stage is seen from a lower surface side.
Figure 4B:
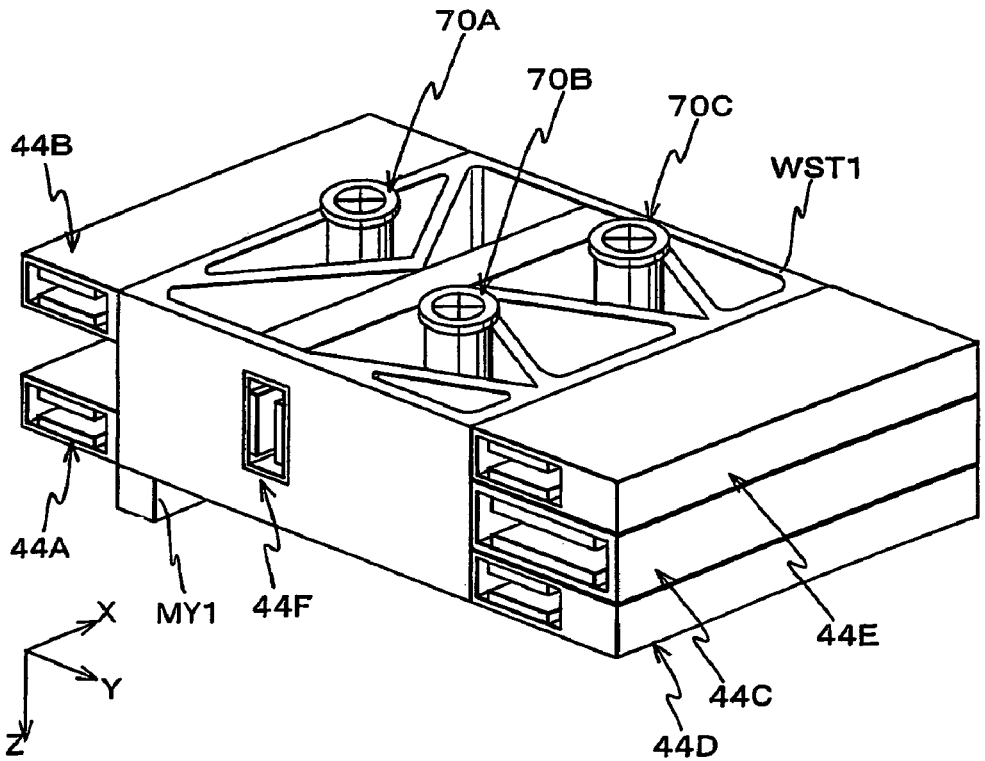
FIG. 4B is a perspective view showing a state in which the flat mirror of FIG. 4A has been removed.

FIG. 4A shows a perspective view in which the movable portion of the wafer stage WST1 side of FIG. 3B is turned upside down. FIG. 4B shows a perspective view where a flat mirror MZ1 (which will be discussed later) mounted to the bottom surface of the wafer stage WST1 of FIG. 4A is removed. As is clear from FIG. 4B, inside of the wafer stage WST1, part of the wafer stage is removed from the bottom surface side thereof, and inside the hollow space that is thus formed, self-weight cancellers 70A, 70B, 70C are arranged as three self-weight support mechanisms.

Figure 5:
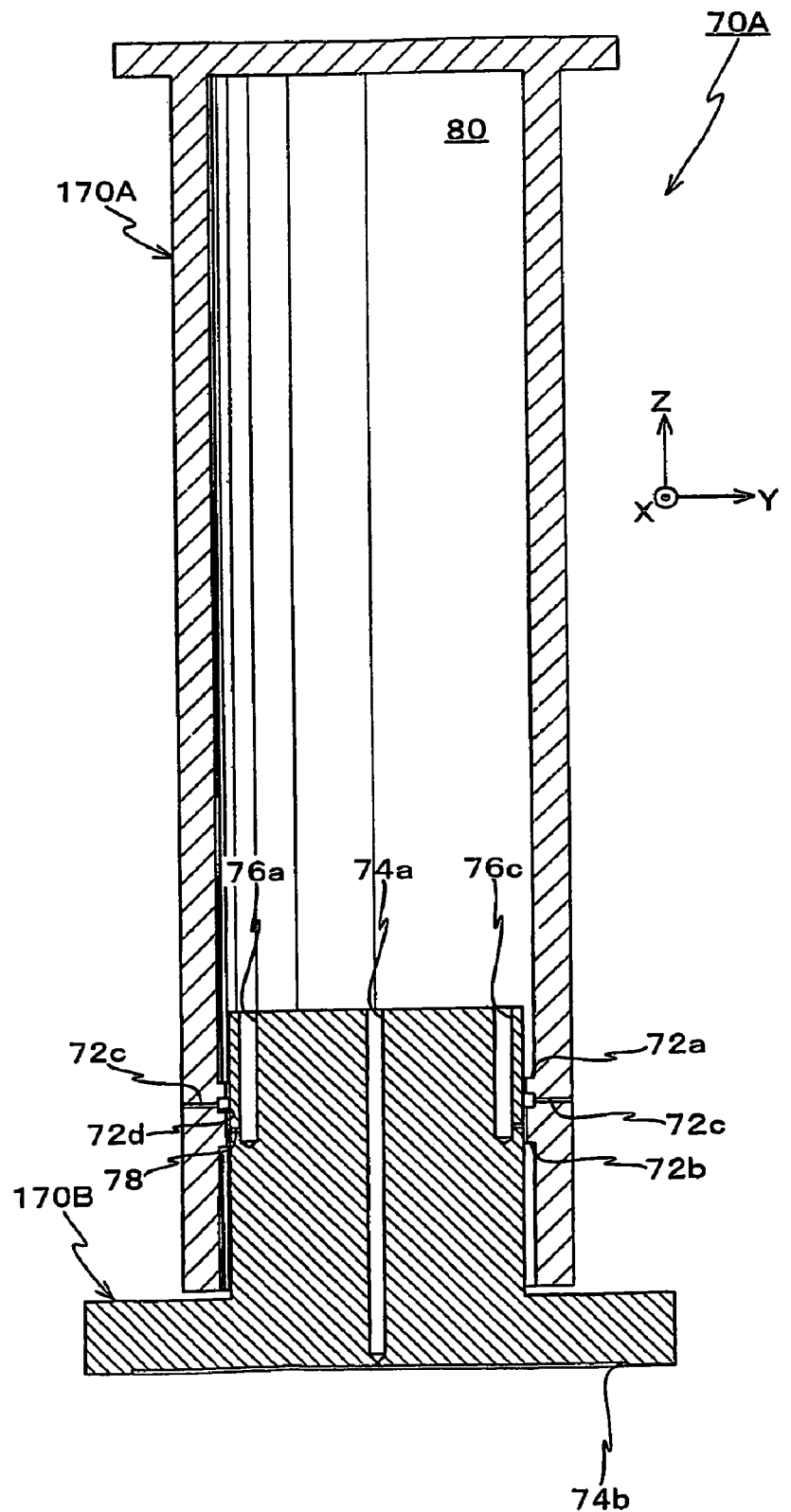
FIG. 5 is a cross-sectional view showing an internal structure of a self-weight canceller.
Figure 6:
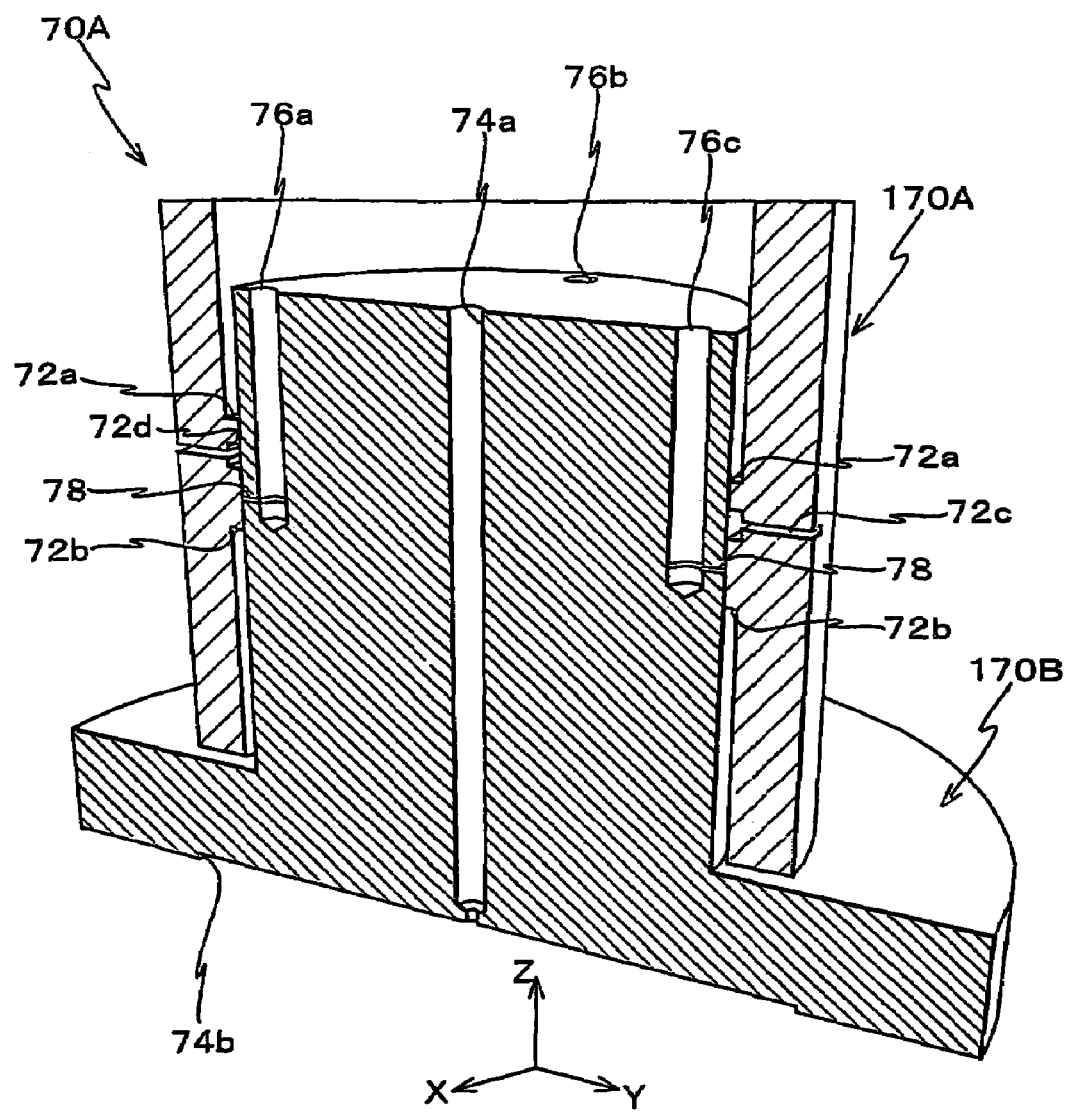
FIG. 6 is a perspective view showing a vertical cross section of the self-weight canceller.
Figure 7:
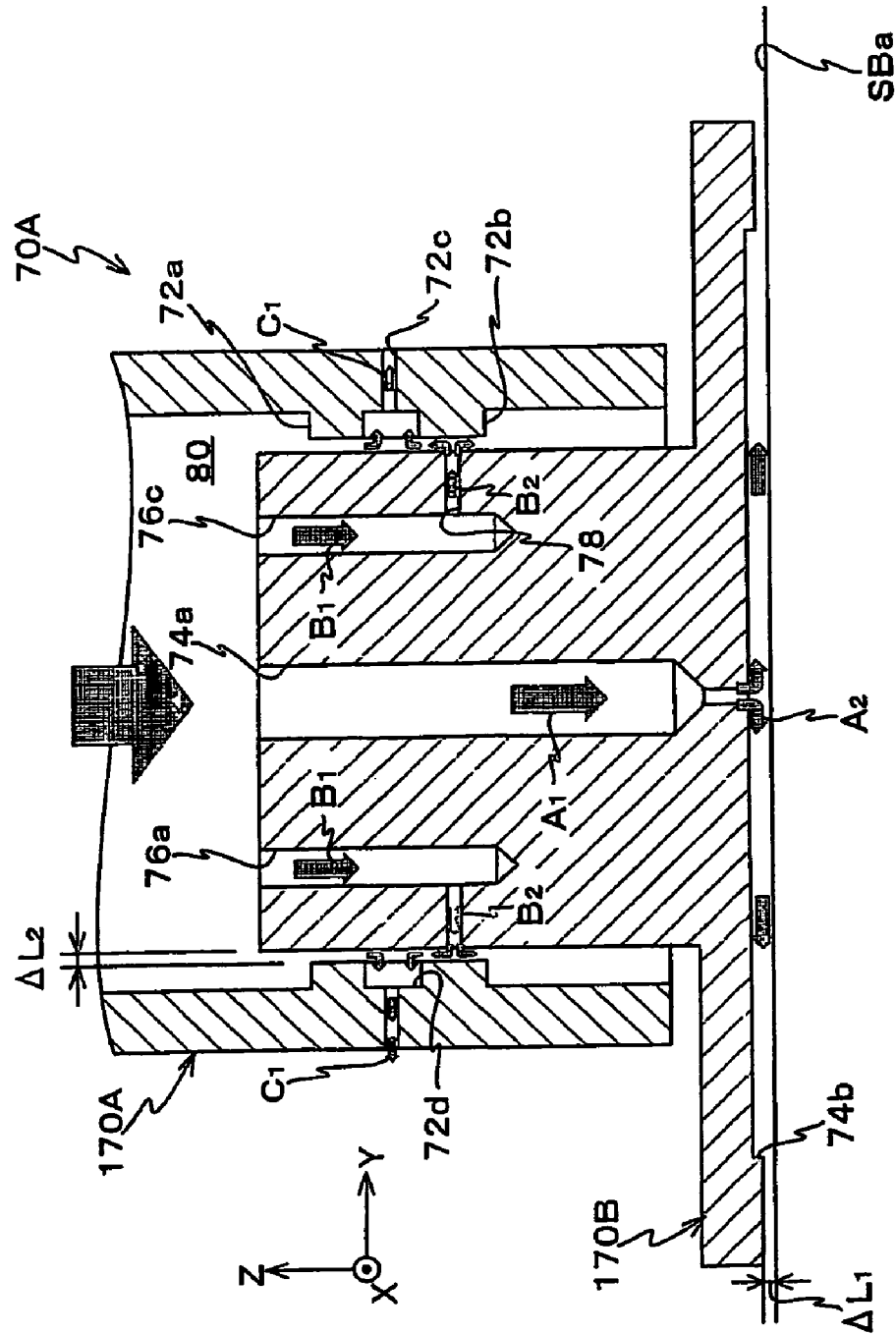
FIG. 7 is a diagram explaining an operation of the self-weight canceller.

The following explains the details of the self-weight canceller 70A of the three self-weight cancellers 70A-70C with reference to FIGS. 5-7.

FIG. 5 is a vertical cross-sectional view showing the self-weight canceller 70A, and FIG. 6 is a perspective view showing a cross section in the vicinity of the lower end portion of the self-weight canceller 70A.

As shown in FIG. 5, the self-weight canceller 70A is provided with a cylinder portion 170A having a lower end portion (−Z side end portion) that is open and the upper end portion (+Z side end portion) that is closed, and a piston portion 170B that is inserted into the cylinder portion 170A via the open end and can be moved relative to the cylinder portion. The outer diameter of the ceiling wall (upper wall) of the cylinder portion 170A is formed slightly larger than that of other portions. In this case, the cylinder portion 170A is integrally molded, but the ceiling wall can be molded separately from the remaining portion, and the portions can be fixed to each other.

In the cylinder portion 170A, in the vicinity of the lower end portion (−Z side end portion), a first annular convex portion 72A is formed over the entire circumference of the inner circumferential surface. Furthermore, under the first annular convex portion 72a (−Z side), a second annular convex portion 72b is formed spaced apart from the first annular convex portion 72a. Additionally, on the bottom surface of an annular concave groove 72d having a predetermined depth and formed between the first and second annular convex portions 72a, 72b of the cylinder portion 170A, a plurality of through holes 72c that connect the outside with the internal space of the cylinder portion 170A are formed at a predetermined interval.

The piston portion 170B is inserted into the cylinder portion 170A in a state where a predetermined clearance is formed between the outer circumferential surface and the first and second annular convex portions 72a, 72b.

The piston portion 170B is circular-shaped with a step formed by a first diameter circular portion and a second diameter (larger than the first diameter) circular portion, concentric with the first circular portion and arranged on the −Z side of the first circular portion. In this piston portion 170B, a vent line 74a is formed as an air supply line in the Z axis direction that extends to the bottom surface from the center of the top end surface. The vent line 74a communicates with a groove 74b formed on the lower end surface (−Z side end surface) of the piston portion 170B and is made so as to become narrower as it approaches the lower end surface in the vicinity of the lower end surface of the piston portion 170B. That is, the lower end portion of the vent line 74a is formed so as to function as a nozzle (convergent nozzle). Furthermore, as shown in FIG. 4A, the groove 74b has a shape that is formed from the combination of a circle and a cross.

Furthermore, in the vicinity of the periphery of the upper end surface of the piston portion 170B, four vent lines 76a-76d (the vent lines 76a, 76c are shown in FIG. 5, and only the vent lines 76a-76c are shown in FIG. 6; the vent line 76d is not depicted) are formed as air supply lines at an angular spacing of 90° from each other. The vent lines are formed so as to extend down to a position slightly above the center portion, in the height direction, of the piston portion 170B. In the vicinity of the lower end portion of the vent lines 76a-76d, restrictions 78 are formed as gas exhaust nozzles communicating with the outside of the outer circumferential surface of the piston portion 170B.

In this case, a substantially airtight space 80 is formed above the piston portion 170B inside of the cylinder portion 170A. One end of the air supply lines is connected to the space 80 via an undepicted opening formed in a portion of the cylinder portion 170A. The other end of the air supply line is connected to an undepicted gas supply device. From this gas supply device, for example, noble gas such as helium or nitrogen, etc. is supplied to the space 80 via the air supply line, and the space 80 is maintained as a positive pressure space in which air pressure is higher than the outside of the cylinder 170A. Therefore, hereafter the space 80 is called "positive pressure space 80."

FIG. 7 shows a schematic view explaining an operation of the above-mentioned self-weight canceller 70A.

As shown in FIG. 7, in the self-weight canceller 70A, the space 80 is defined as a positive pressure space, so a gas flow (hereafter referred to as "flow $A_1$") is generated that is shown by arrow $A_1$ within the vent line 74a. The gas shown by this flow $A_1$ is jetted from the convergent nozzle portion at the lower end of the vent line 74a, and a gas flow is generated that is shown by arrow $A_2$ within the groove 74b. This gas is spread over the groove 74b and jetted to a support surface (here, the top surface of the stage base SB) SBa from the entire groove. Thus, a hydrostatic pressure (pressure within a gap) of a gas between the bottom surface of the piston portion 170B and the support surface forms a predetermined clearance $\Delta L_1$ between the bottom surface of the piston portion 170B and the support surface SBa of the stage base SB. That is, substantially a type of gas hydrostatic pressure bearing is formed on the bottom surface of the piston portion 170B, and the piston portion 170B is floatingly supported above the support surface SBa in a non-contact state. Hereafter, this gas hydrostatic pressure bearing is called a "thrust bearing".

In the same manner as the vent line 74a, a gas flow is generated in vent lines 76a-76d as shown by arrows $B_1$. Accordingly, in the restrictions 78, a gas flow shown by arrows $B_2$ is generated that is from the inside of the piston portion 170B to the outside. The gas jetted from the restrictions 78 is jetted against the second annular convex portion 72b. At this time, by gas hydrostatic pressure (pressure within a gap) between the second annular convex portion 72b and the outer circumferential surface of the piston portion 170B, a predetermined clearance $\Delta L_2$ is formed between the outer circumferential surface of the piston portion 170B and the first and second annular convex portions 72a, 72b. That is, in the peripheral wall of the piston portion 170B, a gas hydrostatic pressure bearing is substantially formed, and a non-contact state is established between the piston portion 170B and the cylinder portion 170A. Hereafter, this gas hydrostatic bearing is called a "radial bearing".

Furthermore, a gas flow shown by arrows $C_1$ is generated in the plurality of through holes 72c formed at a predetermined interval in the annular concave groove 72d of the cylinder portion 170A. By doing this, a gas jetted against the second annular convex portion 72b, a gas within the positive pressure space 80, and a gas within the clearance $\Delta L_2$ are discharged to the outside.

Other self-weight cancellers 70B, 70C are constituted in the same manner as the self-weight canceller 70A.

According to the self-weight cancellers 70A-70C, when the wafer stage WST1 is supported by the upper end portion, the weight is supported by a positive pressure of the positive pressure space 80. At the same time, due to the action of the thrust bearing, it is possible to constantly maintain a clearance $\Delta L_1$ with the top surface of the stage base SB, i.e., the support surface SBa. Furthermore, even when a force is generated in the wafer stage WST1 that is inclined in the inclination direction (θx, θy directions), because of the action of the radial bearing, clearance $\Delta L_2$ is maintained, so the inclination of the wafer stage WST1 is absorbed. Therefore, according to the self-weight cancellers 70A-70C, the wafer stage WST1 is supported by a positive pressure with low stiffness, and the inclination of the wafer stage WST1 can be absorbed.

As is clear from the above-mentioned explanation, a thrust bearing as a first bearing mechanism is constituted by the groove 74b and the vent line 74a, and a radial bearing as a second bearing mechanism is constituted by the restrictions 78 and the vent lines 76a-76d.

As described before, on the bottom surface (the surface of the −Z side) of the wafer stage WST1, the flat mirror MZ1 is attached to the entire region excluding the portion where the self-weight cancellers 70A-70C are arranged (see FIG. 4A). Additionally, when the bottom surface of the wafer stage WST1 is flat, instead of the flat mirror MZ1, the bottom surface of the wafer stage WST1 can be mirror-processed.

Figure 8:
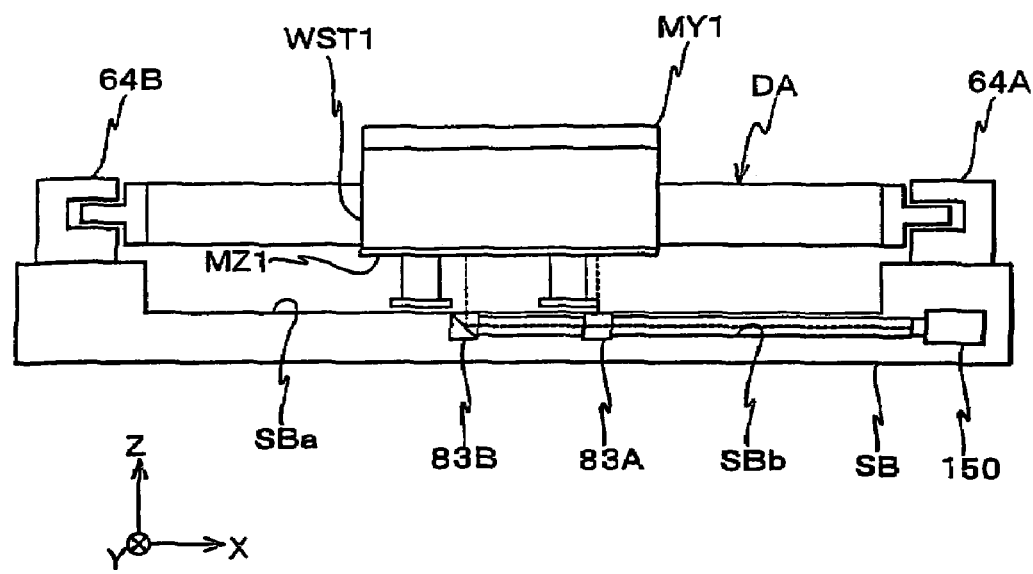
FIG. 8 is a diagram explaining a Z-axis interferometer.

FIG. 8 shows a perspective view schematically showing the wafer stage WST1. As is clear from FIG. 8, in a passage SBb located within the stage base SB, a Z axis interferometer 150 as a light beam interference type length measurement device, a beam splitter 83A formed of a prism or the like that splits a length measurement beam from the Z axis interferometer 150 in the −X direction and the +Y direction, a prism 83B that is arranged on the −X side of a beam splitter 83A and reflects the length measurement beam that has passed through the beam splitter 83A and turns it in the +Z direction, etc. are provided. Furthermore, the length measurement beam reflected by the beam splitter 83A is split by an undepicted beam splitter, and the respective split light beams (length measurement beams) are reflected toward the +Z direction by another prism or the like.

That is, because of this structure, the length measurement beam from the Z axis interferometer 150 is irradiated to three points of the flat mirror MZ1 arranged on the bottom surface of the wafer stage WST1. Furthermore, the returned light of the length measurement beams reflected by the flat mirror MZ1 returns to the Z axis interferometer 150 via the same route, is split separately inside, composed coaxially with the respective reference beams, and the interference light beams are separately received by a detector. Thus, the position and the inclination (rotation amount in θx, θy directions) in the Z axis direction of the wafer stage WST1 are measured. That is, a position detector is constituted by an optical system including the Z axis interferometer 150, the beam splitter 83A, the prism 83B, etc. Of course, three Z axis interferometers could be provided, and the Z position for only one point of the flat mirror MZ1 can be measured by each Z axis interferometer. The measurement value of the Z axis interferometer 150 is supplied to the main controller 50.

In this case, a structure also can be used where the wafer stage WST1 has only one self-weight canceller, so that irradiation of the length measurement beam from the Z axis interferometer 150 to the flat mirror MZ1 by the self-weight cancellers 70A-70C can be greatly suppressed.

Here, with respect to the arrangement of the Z axis interferometer 150, the beam splitter 83A, the prism 83B, etc., an arrangement is desirable in which the position and the rotation in the height direction of the wafer stage WST1 can be constantly measured within a movement range of the wafer stage WST1.

In addition, in the other wafer stage WST2 as well, three self-weight cancellers are arranged in the same manner as the self-weight cancellers 70A-70C arranged in the wafer stage WST1. Because of the three self-weight cancellers, the wafer stage WST2 is supported with low stiffness by a positive pressure, and the inclination of the wafer stage WST2 can be absorbed.

Furthermore, on the bottom surface (surface of the −Z side) of the wafer stage WST2 as well, a flat mirror is mounted to the entire region excluding the portion where the self-weight cancellers are arranged. The length measurement beam from the Z axis interferometer is irradiated to at least three points of the flat mirror via a beam splitter, a prism, etc., arranged on the stage base SB. In the same manner as described before, the position in the Z axis direction of the wafer stage WST2 and the rotation amount in the inclination directions (θx, θy directions) can be measured.

Thus, in this embodiment, the wafer stages WST1, WST2 are floatingly supported above the support surface SBa by the respective three self-weight cancellers (70A-70C), and the Z position and the inclination (rotation amount in θx, θy directions) can be measured by the Z axis interferometer. Because of this, the top surface SBa of the stage base SB does not need to be used as a moving reference surface of the wafer stages WST1, WST2, so the flatness does not need to be made high, as it was in a conventional stage supporting plate, and thus the processing is easier, and the manufacturing costs can be reduced.

Returning to FIG. 1, on the sides in the X axis direction of the projection optical system PL, a pair of alignment systems ALG1, ALG2 are arranged, each as an off-axis type mark detecting system having the same function, at positions equally distant from the optical axis AX (substantially matching the projection center of the reticle pattern image) of the projection optical system PL.

As the alignment systems ALG1, ALG2, in this embodiment, an FIA (Field Image Alignment) system alignment sensor is used that is a type of image processing-type imaging alignment sensor. These alignment systems ALG1, ALG2 are constituted by a light source (for example, halogen lamp), an imaging optical system, an index plate on which an index mark that is a detecting reference is formed, an image pick-up element (CCD), etc. In these alignment systems ALG1, ALG2, a mark that is a detecting target is illuminated by broadband light from the light source, and the reflected light from the mark vicinity is received by the CCD via the imaging optical system and the index mark. At this time, the image of the mark is imaged against the image pick-up surface of the CCD along with the image of the index mark. Furthermore, by performing a predetermined signal processing on an image signal (image pick-up signal) from the CCD, the position of a mark that uses the center of the index mark, which is a detecting reference point, as a reference is measured. An FIA system alignment system, such as the alignment systems ALG1, ALG2, is particularly effective in terms of detecting an asymmetrical mark of an aluminum layer and a wafer surface.

In this embodiment, the alignment system ALG1 is used for position measuring or the like of an alignment mark on the wafer held on the wafer stage WST1 and a reference mark formed on an undepicted reference mark plate fixed on the wafer stage WST1. Furthermore, the alignment system ALG2 is used for position measuring or the like of an alignment mark on the wafer held on the wafer stage WST2 and a reference mark formed on an undepicted reference mark plate fixed on the wafer stage WST2.

The image signal from the alignment systems ALG1, ALG2 is A/D converted by an undepicted alignment controller, the digitized waveform signal is computationally processed, and the position of the mark that uses the index center as a reference is detected. The information of this mark position is sent to the main controller 50 from an undepicted alignment controller.

The following explains the interferometer system that measures the two-dimensional position of the respective wafer stages with reference to FIG. 2.

As shown in FIG. 2, on the reflective surface of the moving mirror MY1 on the wafer stage WST1, along the Y axis passing through the optical axis of the projection optical system PL and the optical axis of the alignment system ALG1, an interferometer beam is irradiated that is shown by a length measurement axis BI1Y from a Y axis interferometer 116. In the same manner, on the reflective surface of the Y moving mirror MY2 on the wafer stage WST2, along the Y axis passing through the optical axis of the projection optical system PL and the optical axis of the alignment system ALG2, an interferometer beam is irradiated that is shown by a length measurement axis BI2Y from a Y axis interferometer 118. Furthermore, the Y axis interferometers 116, 118, by receiving the reflected light from the moving mirrors MY1, MY2, respectively, measure the relative displacement from the reference position of the reflective surface of the respective moving mirrors, and the Y axis direction position of the wafer stages WST1, WST2. Here, the Y axis interferometers 116, 118 are three-axis interferometers each having three optical axes. Other than measuring the Y axis direction of the wafer stages WST1, WST2, pitching (rotation ($\theta x$ rotation) about the X axis) and yawing (rotation in the $\theta z$ direction) can be measured. Output values of the respective optical axes can be independently measured. However, because of the Z axis interferometer, pitching of the wafer stages WST1, WST2 can be measured, so pitching measurement does not necessarily have to be performed by the Y axis interferometers 116, 118.

Additionally, the respective interferometer beams of the measurement axes BI1Y, BI2Y constantly hit the moving mirrors MY1, MY2 within the entire movement range of the wafer stages WST1, WST2. Therefore, with respect to the Y axis direction, during the exposure operation using the projection optical system PL, whenever the alignment systems ALG1, ALG2 are used, the position of the wafer stages WST1, WST2 is controlled based on the measurement values of the length measurement axes BI1Y, BI2Y.

Furthermore, in this embodiment, an X axis interferometer 146 having a length measurement axis BI2X perpendicular to the length measurement axes BI1Y, BI2Y and passing through the optical axis of the projection optical system PL, and X axis interferometers 144, 148 having respective length measurement axes BI1X, BI3X perpendicular to the respective length measurement axes BI1Y, BI2Y and passing through the respective optical axes of the alignment systems ALG1, ALG2 are provided.

In this embodiment, a measurement value of the X axis interferometer 146 having the length measurement axis BI2X passing through the optical axis of the projection optical system PL is used for the X direction position measurement of the wafer stages WST1, WST2 at the time of exposure using the projection optical system PL. A measurement value of the X axis interferometer 144 having the length measurement axis BI1X passing through the optical axis of the alignment system ALG1 is used for the X direction position measurement of the wafer stage WST1 at the time of using the alignment system ALG1 or the like. A measurement value of the X axis interferometer 148 having the length measurement axis BI3X passing through the optical axis of the alignment system ALG2 is used for the X direction position measurement of the wafer stage WST2 at the time of using the alignment system ALG2 or the like.

Thus, in this embodiment, a wafer interferometer system that controls the XY two-dimensional coordinate position of the wafer stages WST1, WST2 is constituted by five interferometers, i.e., the Y axis interferometers 116, 118, and the X axis interferometers 144, 146, and 148.

In this embodiment, the distance between the length measurement beams of the X axis interferometers 144, 146, and 148 is longer than the length of the longitudinal direction of the moving mirrors MX1, MX2. Thus, depending on the circumstance, the length measurement axis of the X axis interferometer may be off of (does not hit) the reflective surfaces of the wafer stages WST1, WST2. That is, at the time of moving from the alignment position to the exposure position, or from the exposure position to the wafer replacement position, there is a case that the interferometer beam of the X axis direction does not hit the moving mirrors of the wafer stages WST1, WST2, and it becomes necessary to switch the interferometer used for controlling position. Upon considering this situation, an undepicted linear encoder is arranged that measures the position in the X axis direction of the wafer stages WST1, WST2.

That is, in this embodiment, in the case of moving the wafer stages WST1, WST2 from the alignment position to the exposure position or from the exposure position to the wafer replacement position, based on the Y positional information of the wafer stages WST1, WST2 to be measured by the Y axis interferometer, and the X positional information of the wafer stages WST1, WST2 to be measured by a linear encoder, the main controller 50 controls the movement of the Y position and the X position of the wafer stages WST1, WST2.

Of course, in the main controller 50, when an interferometer beam from the X axis interferometer of the length measurement axis that has not been used for controlling hits the moving mirrors of the wafer stages WST1, WST2 again, the X axis interferometer is reset (or preset), and then based on only the measurement values of the X axis interferometer and the Y axis interferometer forming the interferometer system, the movement of the wafer stages WST1, WST2 is controlled.

Furthermore, the X axis interferometers 144, 146, and 148 are biaxial interferometers each having two optical axes. Other than the measurement in the X axis direction of the wafer stages WST1, WST2, the measurement of rolling (rotation ($\theta y$ rotation) about the Y axis) is possible. Furthermore, the output values of the respective optical axes can be independently measured. In this case as well, for the same reason as the above explanation, rolling measurement does not have to be performed. However, if the structure is such that the measurement beam from the Z axis interferometer can be placed in a state of not being irradiated to at least one of the three points, it is desirable that rolling measurement is performed. This reasoning can also apply to the pitching measurement.

The measurement values of the respective interferometers that form an interferometer system thus constituted are sent to the main controller 50. In the main controller 50, based on the output values of the respective interferometers, the wafer stages WST1, WST2 are independently controlled via the drive devices DA, DB, and the Y axis linear motors LY1-LY4.

Furthermore, in this embodiment, although this is not depicted, above the reticle R, a TTR (Through The Reticle) type reticle alignment system is arranged that uses an exposure wavelength to simultaneously monitor a reticle mark on the reticle R via the projection optical system PL and a mark on an undepicted reference mark plate on the wafer stages WST1, WST2. Detecting signals of the reticle alignment systems are supplied to the main controller 50 via an undepicted alignment controller. Furthermore, the structure of the reticle alignment system is disclosed in detail in, for example, Japanese Laid-Open Patent Application 7-176468 and U.S. Pat. No. 5,646,413 corresponding thereto. The disclosure of the above-mentioned U.S. patent is incorporated herein by reference in its entirety.

Furthermore, although this is not depicted, auto focus/auto leveling measurement mechanisms (hereafter referred to as "AF/AL systems") for checking a focus position are respectively arranged in the projection optical system PL and the alignment systems ALG1 and ALG2. In the projection optical system PL and the pair of alignment systems ALG1, ALG2, the structure of the exposure apparatus having the AF/AL systems is disclosed in detail in, for example, Japanese Laid-Open Patent Application 10-214783 and U.S. Pat. No. 6,341, 007 corresponding thereto. The disclosure of the above-mentioned U.S. patent is incorporated herein by reference in its entirety.

In the exposure apparatus 10 of this embodiment, while the wafer stage WST1 performs an exposure operation while disposed under the projection optical system PL, on the wafer stage WST2 side, wafer replacement and a wafer alignment operation while under the alignment system ALG2 are performed (see FIGS. 1 and 2). In the same manner, while the wafer stage WST2 performs an exposure operation while under the projection optical system PL, on the wafer stage WST1 side, wafer replacement and a wafer alignment operation immediately under the alignment system ALG1 are performed. That is, in the exposure apparatus 10 of this embodiment, throughput is improved by simultaneously operating the wafer stages WST1, WST2.

At the time of the above-mentioned exposure operation, the position in the Z axis direction of the wafer is measured via the above-mentioned Z axis interferometer 150, and based on the measurement result, the main controller 50 drives the wafer stage WST1 (or WST2) via the drive device DA (or DB). Furthermore, if a length measurement beam from the Z axis interferometer 150 does not hit a flat mirror, the position in the Z direction of the wafer also can be measured by using the AF/AL system. Furthermore, the Z position measurement of the wafer by the Z axis interferometer 150 and the AF/AL system is simultaneously performed, and based on both measurement results, the Z axis direction position of the wafer stage also can be controlled.

In the above-mentioned wafer replacement, unloading of an exposed wafer placed on the wafer stage WST1 (or wafer stage WST2) and loading of a new wafer are performed by an undepicted wafer loader.

In addition, in the wafer alignment operation, by using the alignment systems ALG1 or ALG2, EGA (Enhanced Global Alignment) type wafer alignment is performed that is disclosed in, for example, Japanese Laid-Open Patent Application 61-44429 and U.S. Pat. No. 4,780,617 corresponding thereto. The disclosure of the above-mentioned U.S. patent is incorporated herein by reference in its entirety.

After such wafer alignment is completed, a step-and-scan type exposure operation is performed where a between-shot stepping operation that moves the wafer stage WST1 (or wafer stage WST2) to an acceleration start position for exposure of one of the respective shot areas on the wafer W1 (or wafer W2) and an exposure operation that transfers a pattern of a reticle R to a shot area of the exposure target by the scanning exposure are repeated. Furthermore, this exposure operation is performed in the same manner as an ordinary scanning stepper, so the detailed explanation is omitted here.

In the above-mentioned exposure operation, the main controller 50 micro-drives the wafer stage WST1 (or WST2) in the six degrees-of-freedom directions via the drive device DA (or DB) while driving the wafer stage WST1 (or WST2) in the Y axis direction (scanning direction) via a pair of Y axis linear motors LY1, LY2 (or LY3, LY4). In particular, with respect to the scanning direction, in order to absorb a synchronization error between the wafer stage and the reticle stage RST, which is driven by a pair of Y axis linear motors, the wafer stage can be micro-driven by the Y axis micro-moving motors VY1, VY2.

As described above in detail, according to the stage device 20 of this embodiment, by the drive device DA (or DB) having the moving elements 44A-44F arranged on the wafer stage WST1 (or WST2) and the stators 46A-46F extending along the X axis direction, by causing a drive force to act parallel to the XY plane on the wafer stage WST1 (or WST2), the wafer stage WST1 (or WST2) is driven in a two-dimensional plane (XY plane) direction (X axis, Y axis and θz directions) perpendicular to a direction of gravity (Z axis direction), in a direction inclined with respect to the XY plane (θx, θy directions), and in the Z axis direction. By doing this, a wafer stage, and in turn, a wafer that is held by the wafer stage, can be moved in the six degrees-of-freedom directions, even without using a complex stage having a moving body that can be moved within the two-dimensional plane and a table that can be moved in the inclination direction on the moving body, as was conventionally used. In this case, the wafer stage can be manufactured as an integral object, and the structure of the wafer stage can be simplified. There is no fear of deterioration of the stage position control as occurred in the above-mentioned table position control due to the combination of the two-dimensional moving stage and the table, that was a conventional problem. Therefore, highly accurate position control of a wafer that is held on the wafer stage can be accomplished in a simplified structure.

Furthermore, in the stage device 20 of this embodiment, the wafer stage is box-shaped, so high stiffness of the wafer stage can be accomplished. Thus, the wafer stage can be stably driven. That is, positioning of the wafer with high accuracy can be accomplished.

Furthermore, on the wafer stage WST1, WST2 that holds the wafer and can be moved within the XY plane, the self-weight cancellers 70A-70C are arranged that are provided with a cylinder portion 170A and a piston portion 170B that is inserted into the cylinder portion 170A and can be moved relative to the cylinder portion and supports the weight of the wafer stage above the stage base SB by a positive pressure of a gas inside the cylinder portion that downwardly urges the piston portion in a direction of gravity. Therefore, by supporting the self-weight of the wafer stages WST1, WST2 by a gas positive pressure, stiffness can be lower than that of an air bearing mechanism that supports a conventional wafer stage in the Z axis direction. Because of this, transmission of vibration of the stage base SB to the wafer stages WST1, WST2 can be suppressed. Thus, in view of this point as well, highly accurate position control of the stage can be accomplished.

In addition, in this embodiment, a Z axis interferometer is arranged that measures the Z axis direction position of the wafer stages WST1, WST2. Thus, the position of the height direction of the wafer stages WST1, WST2 can be constantly detected. In this case, in order to improve exposure accuracy, when an exit port of an air adjusting system of a down flow air system is arranged above the wafer stage, the Z axis interferometer is arranged in a space where a gas environment under the wafer stage is stabilized. Thus, generation such as fluctuation of the interferometer beams, etc. can be suppressed, and the position of the height direction of the wafer stage can be detected with high accuracy.

Furthermore, the self-weight cancellers 70A-70C are provided with a thrust bearing forming a predetermined clearance with the top surface (support surface) of the stage base SB. Thus, the wafer stages WST1, WST2 can be supported in a non-contact manner with respect to the stage base SB.

Additionally, a thrust bearing is constituted by the groove (gas exit port) 74b formed on the surface of the side opposite to the top surface of the stage base SB of the piston portion 170B, and the vent line 74a that connects the groove 74b and a positive pressure space inside the cylinder 170A and is formed in the piston portion 170B. Therefore, without separately having a bearing mechanism that needs piping or the like, a non-contact state between the self-weight cancellers and the stage base can be accomplished.

In addition, each of the self-weight cancellers 70A-70C is provided with a radial bearing that forms a predetermined clearance between an inner circumferential surface of the cylinder portion 170A and an outer circumferential surface of the piston portion 170B. Thus, inclination of the wafer stage can be absorbed. By doing this, vibration of the wafer stages can be suppressed. In this case as well, the radial bearing is constituted by a gas exit port (restriction) formed on the outer circumferential surface of the piston portion 170B and air supply lines (vent lines) 76a-76d that connect the gas exit port (restriction) 78 and a positive pressure space inside the cylinder 170A. Thus, a bearing mechanism that needs a separate pipe or the like does not have to be provided. Therefore, there is no possibility of dragging a pipe, etc., and drive control of the wafer stage with high accuracy can be performed.

Furthermore, the three self-weight cancellers are not arranged on a straight line (they form the points of a triangle), so the wafer stage can be stably supported with respect to the Z axis direction.

Additionally, according to the exposure apparatus 10 of this embodiment, the stage device 20 is provided that can perform highly accurate position control. Thus, a pattern formed on the reticle can be transferred onto the wafer with high accuracy. Furthermore, in this embodiment, two wafer stages WST1, WST2 are provided. Thus, an exposure operation, an alignment operation, etc. can be parallel-processed on the two wafer stages. Therefore, throughput can be improved.

Furthermore, in the above-mentioned embodiment, the wafer stages WST1, WST2 are driven in six degrees-of-freedom directions, but this invention is not limited to this. In stage devices practicing this aspect of the invention, the stage, and in turn, an object that is held on the stage, can be driven in at least one degree-of-freedom direction among directions within a two-dimensional plane, and in a direction inclined with respect to the two-dimensional plane (one degree-of-freedom direction or two degrees-of-freedom directions).

In addition, in the above-mentioned embodiment, a case is explained where the wafer stage is used for a twin stage type stage device provided with two wafer stages, but this invention is not limited to this. The invention also can be used for a single wafer stage device provided with one wafer stage. Furthermore, a multi-type wafer stage device also can be used that is provided with three wafer stages or more.

Furthermore, if a switching type twin stage is formed by adding a structure where the wafer stages WST1, WST2 are detachable from the stators, and the wafer stages WST1, WST2 are interchangeable with each other, then it becomes possible to use one alignment system.

In addition, in the above-mentioned embodiment, the position of the wafer stage in the Z axis direction is measured by a Z axis interferometer, but this invention is not limited to this. Without having a Z axis interferometer, the Z axis direction position of the wafer stage also can be measured by using an AF mechanism.

Furthermore, in the above-mentioned embodiment, the wafer stage is box-shaped, but this invention is not limited to this. Movable elements of the respective motors can be arranged on the wafer stage side, corresponding to a plurality of stators arranged along a predetermined uniaxial direction, so any shape of the wafer stage can be used.

Figure 9:
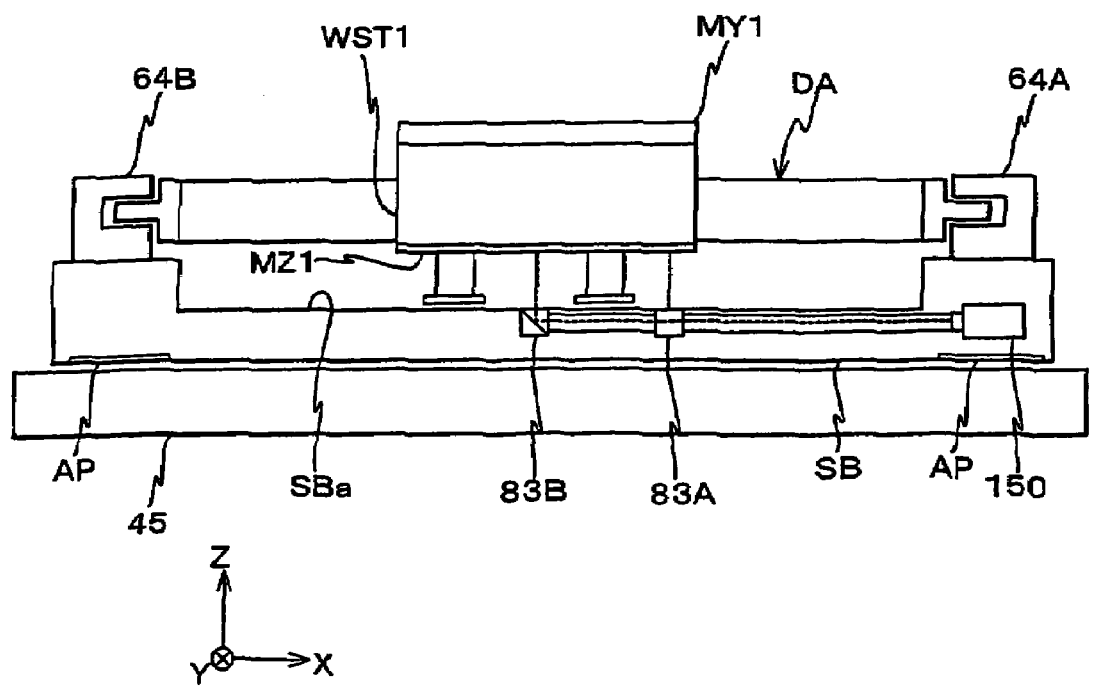
FIG. 9 is a diagram explaining a modified exemplary embodiment.
Figure 11A:
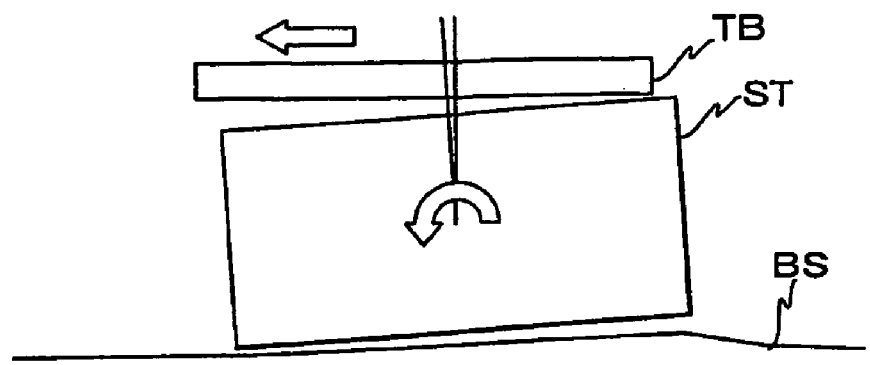
FIGS. 11A-C are diagrams for explaining background technology.
Figure 11B:
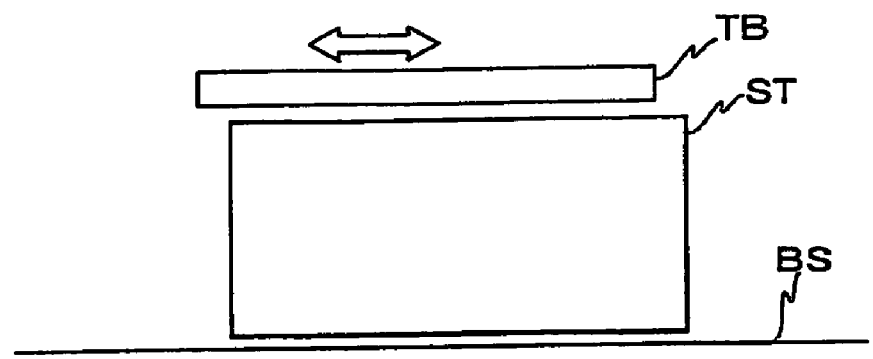
Figure 11C:
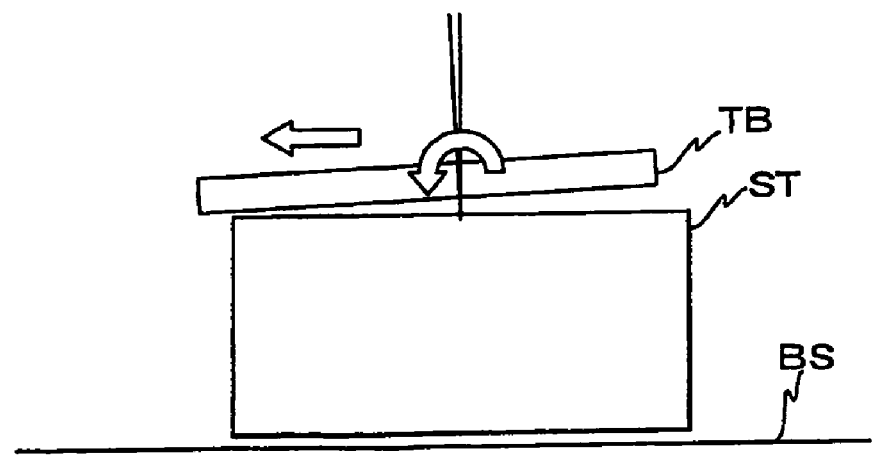

Additionally, in the above-mentioned embodiment, a case is explained in which the stage base SB is substantially horizontally supported on the floor via an undepicted vibration isolation unit, but this invention is not limited to this. For example, as shown in FIG. 9, the structure may be such that the stator 64A of the Y axis linear motor LY1, LY3 and the stator 64B of the Y axis linear motor LY2, LY4 are fixed to the stage base SB, and a plurality of air pads AP are arranged on the bottom surface of the stage base SB. Thus, because of these air pads AP, the above-mentioned structural parts can be floatingly supported with the stage base SB in a non-contact manner above the top surface of another stage base 45. If this type of structure is used, when the wafer stages WST1, WST2 are moved within the XY plane, a reaction force generated from a drive force that causes the stage movement acts on the stators 64A, 64B. Thus, according to the law of conservation of momentum, the stage base SB is moved in a direction that cancels the reaction force. Therefore, generation of vibration due to the movement of the wafer stages WST1, WST2 within the XY plane can be substantially reliably suppressed. At the same time, the movement of a center-of-gravity position of the system including the stage base does not occur (due to the movement of the stage base SB), so generation of an imbalanced load can be suppressed. Furthermore, in this case, the stage base SB naturally has a large mass (weight), so the moving stroke of the stage base SB is not large. In addition, the stage base SB also can be provided with a drive mechanism (trim motor) that can be driven within the XY plane. In this case, when there is no effect on exposure, etc., the position of the stage base SB can be returned to a predetermined position by the trim motor.

Furthermore, in the above-mentioned embodiment, although a structure is used in which the wafer stages are provided with self-weight cancellers, this invention is not limited to this. A structure also can be used in which the weight of the wafer stages is supported by the Z axis micro-moving motor VZ that generates a drive force in the Z axis direction.

In addition, in the above-mentioned embodiment, although a case is explained in which the stage device of this invention is used for a wafer drive system, this invention is not limited to this. A stage device of this invention also can be applied as a reticle drive system. FIG. 10 shows an example of applying the stage device of this invention to a reticle drive system.

A stage device 101 on the reticle side shown in FIG. 10 is provided with a reticle stage RST' as an approximately flat stage holding the reticle R and a drive device that drives the reticle stage RST' in the Y axis direction at a long stroke and micro-drives the reticle stage RST' in the X axis direction, the Z axis direction, and θx, θy, θz directions.

The drive device is provided with Y axis linear motors $103_1$-$103_4$ that cause a drive force in the Y axis direction to act on the reticle stage RST', an X axis micro-moving motor 105 that causes a drive force in the X axis direction to act on the reticle stage RST', and Z axis micro-moving drive motors $107_1$, $107_2$ that cause a drive force in the Z axis direction to act on the reticle stage RST'.

The Y axis linear motor $103_1$, is provided with a magnetic pole unit 113A embedded in the reticle stage RST' and an armature unit 113B arranged opposite to the magnetic pole unit 113A. A drive force in the Y axis direction is generated by an electromagnetic interaction between an alternating field in the Y axis direction formed by the magnetic pole unit 113A and an electric current that flows through a plurality of armature coils arranged within the armature unit 113B. The other Y axis linear motors $103_2$-$103_4$ are constituted in the same manner.

The X axis micro-moving motor 105 is constituted by a voice coil motor, and is provided with a permanent magnet 115A that is arranged on the −X side end portion of the reticle stage RST', and that extends in the Y axis direction as a longitudinal direction, and an armature unit 115B that is arranged on a supporting plate 99 via the mounting member 97 and extends in the Y axis direction as a longitudinal direction. An XZ cross section of the armature unit 115B is U-shaped. Within the armature unit 115B, an armature coil is arranged where an electric current flows through the field formed by the permanent magnet 115A in the Y axis direction. A drive force in the X axis direction that acts on the reticle stage RST' is generated by an electromagnetic interaction between an electric current in the Y axis direction and a magnetic field in the Z axis direction by the permanent magnet.

The Z axis drive motors $107_1$, $107_2$ also are constituted by voice coil motors in the same manner as the X axis micro-moving motor 105, and are provided with a permanent magnet arranged on the lower end surface of the reticle stage RST', and a magnetic pole unit that is U-shaped in cross section and arranged on the supporting plate 99. By doing this, a drive force in the Z axis direction acts on the reticle stage RST'.

According to the drive device thus constituted, the reticle stage RST' is driven in the X, Y, Z axis directions. Furthermore, by having a drive force of the lower linear motors $103_2$, $103_4$ that is different from a drive force of the upper linear motors $103_1$, $103_3$, among the Y axis linear motors $103_1$-$103_4$, the reticle stage RST' can be micro-driven in the rotation direction (pitching direction) about the X axis. By having a drive force of the linear motors $103_3$, $103_4$, that are positioned on the +X side of the reticle R, that is different from a drive force of the linear motors $103_1$, $103_2$, that are positioned on the −X side of the reticle R, the reticle stage RST' can be micro-driven in the rotation direction (yawing direction) about the Z axis. Furthermore, by having different drive forces of the two Z axis drive motors $107_1$, $107_2$, the reticle stage RST' can be micro-driven in the rotation direction (rolling direction) about the Y axis.

Thus, by using the above structure as a stage device on the reticle side, without using a reticle stage that has a coarse/micro-moving structure, the reticle stage RST' can be driven in the six degrees-of-freedom directions. By doing this, highly accurate position control of the reticle becomes possible, and a small and light reticle stage can be designed.

Furthermore, in the structure of FIG. 10, instead of the X axis micro-moving motor 105, a pair of X axis micro-moving motors arranged on upper and lower rows also can be used. Thus, by having a different drive force in the X axis direction generated by a pair of X axis micro-moving motors, respectively, the reticle stage RST' can be micro-driven in the rotation direction (rolling direction) about the Y axis.

Therefore, by replacing the stage device on the reticle side shown in FIG. 1 with each structural element on the reticle side including the reticle stage RST of the above-mentioned FIG. 10, the same operational effect as the exposure apparatus 10 of the above-mentioned embodiment can be given, and exposure accuracy can be improved because position controllability of the reticle R and synchronization accuracy of the reticle and the wafer can be improved.

Of course, the stage device of this invention also can be applied to only the reticle drive system.

In addition, in the structure of FIG. 10, the stators of the Y axis linear motors that drive the reticle stage RST' in the Y axis direction can be fixed to a rectangular frame-shaped member that is floatingly supported above the supporting plate 99 in a state in which it surrounds the reticle stage. By doing this, the frame-shaped member is moved in the Y axis direction by the reaction force generated during the driving of the reticle stage. Thus, the reaction force can be canceled. In this case as well, a trim motor also can be arranged that drives the rectangular frame-shaped member.

Furthermore, in the above-mentioned embodiment, a case was explained in which this invention is applied to a step-and-scan type scanning exposure apparatus, but this invention is not limited to this. That is, this invention can be applied to a step-and-repeat type projection exposure apparatus, a step-and-stitch type projection exposure apparatus, etc.

In addition, in the above-mentioned embodiment, far ultraviolet light such as a KrF excimer laser as illumination light IL, vacuum ultraviolet region light such as an $F_2$ laser, an ArF excimer laser, etc., or bright lines (g line, i line, etc.) of an ultraviolet area from an extra-high pressure mercury lamp, etc. was used, but other vacuum ultraviolet light such as an $Ar_2$ laser beam (wavelength 126 nm), etc. also can be used. Furthermore, for example, the invention is not limited to a laser beam output from the above-mentioned respective light sources as vacuum ultraviolet light, but harmonics also can be used in which an infrared region or visible single wavelength laser light beam vibrated from a DFB semiconductor laser or a fiber laser is amplified by a fiber amplifier in which, for example, erbium (Er) (or both erbium and ytterbium (Yb)) is doped and wavelength-converted to ultraviolet light by using nonlinear optical crystal.

Furthermore, this invention also can be applied to an exposure apparatus using charged particle rays such as EUV light, X-rays, or an electron beam, an ion beam, etc. as illumination light IL, for example, a proximity type exposure apparatus without a projection optical system, a mirror projection aligner, and a liquid immersion type exposure apparatus where liquid is filled between the projection optical system PL and the wafer as disclosed in, for example, International Publication WO99/49504. A liquid immersion type exposure apparatus can use a scanning exposure method using a catadioptric type projection optical system, or a scanning exposure method using a projection optical system in which projection magnification is ⅛. In the latter liquid immersion type exposure apparatus, in order to form a large pattern on an object such as a wafer, it is preferable that the above-mentioned step-and-stitch type is used.

Furthermore, the projection exposure apparatus of the above embodiment can be manufactured by incorporating and optically adjusting an illumination optical system composed of a plurality of lenses and a projection optical system into the main body of the exposure apparatus, connecting wires and pipes and installing the reticle stage and wafer stage composed of various mechanical parts to the main body of the exposure apparatus, and further performing overall adjustments (electrical adjustment, operation check, etc.). Furthermore, it is preferable that manufacturing of the projection exposure apparatus is performed in a clean room with controlled temperature, cleanliness, etc.

Furthermore, this invention is not limited to an exposure apparatus for manufacturing a semiconductor device, but also can be applied to an exposure apparatus that is used for manufacturing a display including a liquid crystal display element, etc. and that transfers a device pattern onto a glass plate, an exposure apparatus that is used for manufacturing a thin film magnetic head and that transfers a device pattern onto a ceramic wafer, and an exposure apparatus that is used for manufacturing an image pick-up element (CCD, etc.), a micro-machine, an organic EL, a DNA chip, or the like. In addition, in order to manufacture a reticle or a mask to be used for a light exposure apparatus, an EUV exposure apparatus, an X-ray exposure apparatus, an electron beam exposure apparatus, etc. in addition to a micro-device such as a semiconductor element, this invention also can be applied to an exposure apparatus that transfers a circuit pattern onto a glass substrate or a silicon wafer. Here, in an exposure apparatus using DUV (far ultraviolet) light, VUV (vacuum ultraviolet) light, etc., in general, a transmissive type reticle is used. As a reticle substrate, quartz glass, quartz glass where fluoride is doped, fluorite, magnesium fluoride, or a crystal, etc. can be used. Furthermore, in a proximity type X-ray exposure apparatus or an electron beam exposure apparatus, etc., a transmissive mask (stencil mask, membrane mask) is used, and a silicon wafer or the like can be used as a mask substrate.

The semiconductor device is manufactured via a step of designing a performance capability and a function of the device, a step of manufacturing a reticle based on the designing step, a step of manufacturing a wafer from a silicon material, a step of transferring a reticle pattern onto a wafer according to the above-mentioned method by using the exposure apparatus of the above-mentioned embodiment (exposure step), a step of assembling a device (including a dicing process, a bonding process, a packaging process), a step of testing, etc. In this case, in an exposure step, the exposure apparatus and the exposure method of the above-mentioned embodiment are used, so the reticle pattern can be transferred onto the wafer with high accuracy; thus, productivity (including yield) of devices with high integration can be ultimately improved.

Thus, the stage device of this invention is suitable for use as a stage by which an object is positioned. Furthermore, the exposure apparatus of this invention is suitable for transferring a pattern onto a photosensitive object. In addition, the method of manufacturing a device of this invention is suitable for manufacturing a micro-device.

While the invention has been described with reference to preferred embodiments thereof, it is to be understood that the invention is not limited to the preferred embodiments or constructions. The invention is intended to cover various modifications and equivalent arrangements. In addition, while the various elements of the preferred embodiments are shown in various combinations and configurations, that are exemplary, other combinations and configurations, including more, less or only a single element, are also within the spirit and scope of the invention.

What is claimed is:

1. A stage device comprising:
   a stage that holds an object and that is movable at least in a direction within a two-dimensional plane perpendicular to a direction of gravity and in a direction inclined with respect to the two-dimensional plane; and
   a drive device including a plurality of movable elements connected to the stage and a plurality of stators that apply a driving force by cooperation with corresponding ones of the plurality of movable elements, the plurality of stators extend along a single predetermined axial direction within the two-dimensional plane, and that drives the stage, parallel and inclined to the predetermined axial direction, by applying a drive force to the stage in a direction parallel to the two-dimensional plane.

2. The stage device according to claim 1, wherein the drive device drives the stage in a rotation direction within the two-dimensional plane.

3. The stage device according to claim 1, wherein the drive device also drives the stage in the direction of gravity.

4. The stage device according to claim 3, wherein a stator that drives the stage in the direction of gravity is between among a plurality of the stators that drive the stage in a direction within the two-dimensional plane.

5. The stage device according to claim 1, wherein the drive device drives the stage with three degrees-of-freedom within the two-dimensional plane, two degrees-of-freedom in a direction inclined with respect to the two-dimensional plane, and one degree-of-freedom in the direction of gravity.

6. The stage device according to claim 1, wherein the stage is box-shaped.

7. The stage device according to claim 1, further comprising: a length measurement device that irradiates a length measurement beam onto a reflective surface arranged on the stage, receives the light of the length measurement beam reflected at the reflective surface, and measures a position of the stage in the direction of gravity.

8. An exposure apparatus that illuminates a mask by an energy beam and transfers a pattern formed on the mask onto a photosensitive object, comprising: the stage device according to claim 1 as a drive system of at least one of the mask and the photosensitive object.

9. A method of manufacturing a device including a lithographic process: wherein, in the lithographic process, by using the exposure apparatus according to claim 8, a pattern formed on the mask is transferred onto a photosensitive object.

10. An exposure apparatus that illuminates a mask by an energy beam and transfers a pattern formed on the mask onto a photosensitive object, comprising: the stage device according to claim 1 as a drive system of at least one of the mask and the photosensitive object.

11. A method of manufacturing a device including a lithographic process: wherein, in the lithographic process, by using the exposure apparatus according to claim 10, a pattern formed on the mask is transferred onto a photosensitive object.

12. A stage device comprising:
    a first stage that holds a first object;
    a second stage that holds a second object; and
    a drive system that drives the respective stages at least in a direction within a two-dimensional plane perpendicular to a direction of gravity and in a direction inclined with respect to the two-dimensional plane by applying a drive force to the respective stages in a direction parallel to the two-dimensional plane, the drive system including:
       a plurality of drive devices arranged individually corresponding to the respective stages, the respective drive devices being provided with a plurality of stators that extend along a single predetermined axial direction within the two-dimensional plane and a plurality of movable elements that are connected to the respective stages and correspond to the respective stators, wherein the drive devices drive the corresponding stages at least in a direction within the two-dimensional plane perpendicular to the direction of gravity and in the direction inclined with respect to the two-dimensional plane by applying a drive force to the corresponding stages in the direction parallel to the two-dimensional plane.

13. The stage device according claim 12, wherein the respective drive devices drive the respective stages in a rotation direction within the two-dimensional plane.

14. The stage device according to claim 12, wherein the respective drive devices also drive the respective stages in the direction of gravity.

15. An exposure apparatus that illuminates a mask by an energy beam and transfers a pattern formed on the mask onto a photosensitive object, comprising: the stage device according to claim 12 as a drive system of at least one of the mask and the photosensitive object.

16. A method of manufacturing a device including a lithographic process: wherein, in the lithographic process, by using the exposure apparatus according to claim 15, a pattern formed on the mask is transferred onto a photosensitive object.

* * * * *

UNITED STATES PATENT AND TRADEMARK OFFICE
CERTIFICATE OF CORRECTION

PATENT NO. : 7,589,823 B2  Page 1 of 1
APPLICATION NO. : 11/133372
DATED : September 15, 2009
INVENTOR(S) : Yuichi Shibazaki It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 551 days.

Signed and Sealed this

Twenty-first Day of September, 2010

David J. Kappos
*Director of the United States Patent and Trademark Office*